US009245710B2

(12) United States Patent
Gunji et al.

(10) Patent No.: US 9,245,710 B2
(45) Date of Patent: Jan. 26, 2016

(54) CHARGED PARTICLE BEAM DEVICE

(71) Applicant: HITACHI HIGH-TECHNOLOGIES CORPORATION, Tokyo (JP)

(72) Inventors: Kazuhiro Gunji, Tokyo (JP); Yasushi Ebizuka, Tokyo (JP); Yuta Asaga, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/379,694

(22) PCT Filed: Feb. 20, 2013

(86) PCT No.: PCT/JP2013/054224
§ 371 (c)(1),
(2) Date: Aug. 19, 2014

(87) PCT Pub. No.: WO2013/129210
PCT Pub. Date: Sep. 6, 2013

(65) Prior Publication Data
US 2015/0060694 A1    Mar. 5, 2015

(30) Foreign Application Priority Data

Mar. 2, 2012  (JP) ................................ 2012-046046

(51) Int. Cl.
H01J 37/18   (2006.01)
H01J 37/16   (2006.01)
H01J 37/20   (2006.01)
H01J 37/28   (2006.01)

(52) U.S. Cl.
CPC ............... *H01J 37/18* (2013.01); *H01J 37/185* (2013.01); *H01J 37/28* (2013.01); *H01J 2237/18* (2013.01); *H01J 2237/204* (2013.01); *H01J 2237/28* (2013.01); *H01J 2237/2801* (2013.01)

(58) Field of Classification Search
CPC ......... H01J 37/18; H01J 37/185; H01J 37/16; H01J 37/20; H01J 37/22; H01J 37/28
USPC .............. 250/441.11, 492.2, 310, 311, 396 R, 250/440.11, 492.1, 492.3; 118/719
See application file for complete search history.

(56) References Cited

U.S. PATENT DOCUMENTS 4,020,353 A * 4/1977 Saito et al. ................ 250/441.11
4,066,905 A * 1/1978 Dassler et al. ............ 250/396 R
(Continued)

FOREIGN PATENT DOCUMENTS

JP         63-134186 U    9/1988
JP          4-105079 A    4/1992
JP        2010-086926 A   4/2010

OTHER PUBLICATIONS

International Search Report and Written Opinion issued in International Application No. PCT/JP2013/054224 dated Mar. 19, 2013 with partial English translation.

*Primary Examiner* — David A Vanore
(74) *Attorney, Agent, or Firm* — McDermott Will & Emery LLP

(57) ABSTRACT

A charged particle beam device that appropriately maintains a throughput of the device for each of specimens different in a gas emission volume from each other is provided. A scanning electron microscope includes an electron source, a specimen stage, a specimen chamber, and an exchange chamber, and further includes a vacuum gauge that measures an internal pressure of the exchange chamber, a time counting unit that counts time taken when a measurement result by the vacuum gauge has reached a predetermined degree of vacuum, and an integral control unit that performs comparative calculation and determination based on a measurement result by the time counting unit and integral control based on a process flow. And, the integral control unit controls changing of a content of a subsequent process based on a shift of the degree of vacuum of the exchange chamber.

5 Claims, 12 Drawing Sheets

(56) References Cited

U.S. PATENT DOCUMENTS

| | | | |
|---|---|---|---|
| 4,426,439 A * | 1/1984 | Kobayashi et al. | 430/269 |
| 8,348,234 B2 * | 1/2013 | Duelli | 251/204 |
| 8,933,422 B2 * | 1/2015 | Ishii et al. | 250/492.1 |
| 2013/0200271 A1 | 8/2013 | Ishii et al. | |
| 2015/0060694 A1 * | 3/2015 | Gunji et al. | 250/440.11 |

* cited by examiner

FIG. 6A

| SETTING | RESULT | GRAPH |

| SELECTION | NAME | PROCESS | PRESSURE | TIME |
|---|---|---|---|---|
| ● | AAA1 | aaa | ppp1 | ttt1 |
|  | AAA2 | aaa | ppp2 | ttt2 |
|  | BBB | bbb | ppp3 | ttt3 |
|  | CCC | ccc | ppp4 | ttt4 |

FIG. 6B

| SETTING | RESULT | GRAPH |

| SELECTION | NAME | PROCESS | PRESSURE | TIME |
|---|---|---|---|---|
| ● | AAA1 | aaa | ppp1 | ttt1 |

| No. | DEGREE OF VACUUM OF SPECIMEN CHAMBER AFTER OPEN OF SPECIMEN-CHAMBER VALVE | TIME UNTIL ELECTRON-GUN VALVE OPENS |
|---|---|---|
| 1 | ppp11 | ttt11 |
| 2 | ppp12 | ttt12 |
| 3 | ppp13 | ttt13 |
| max | ppp101 | ttt101 |
| min | ppp102 | ttt102 |
| ave | ppp103 | ttt103 |
| 3σ | ppp104 | ttt104 |

FIG. 6C

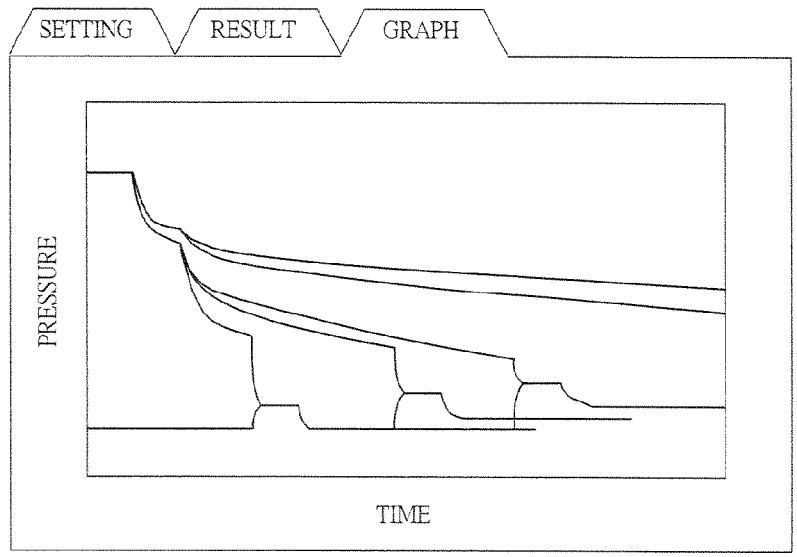

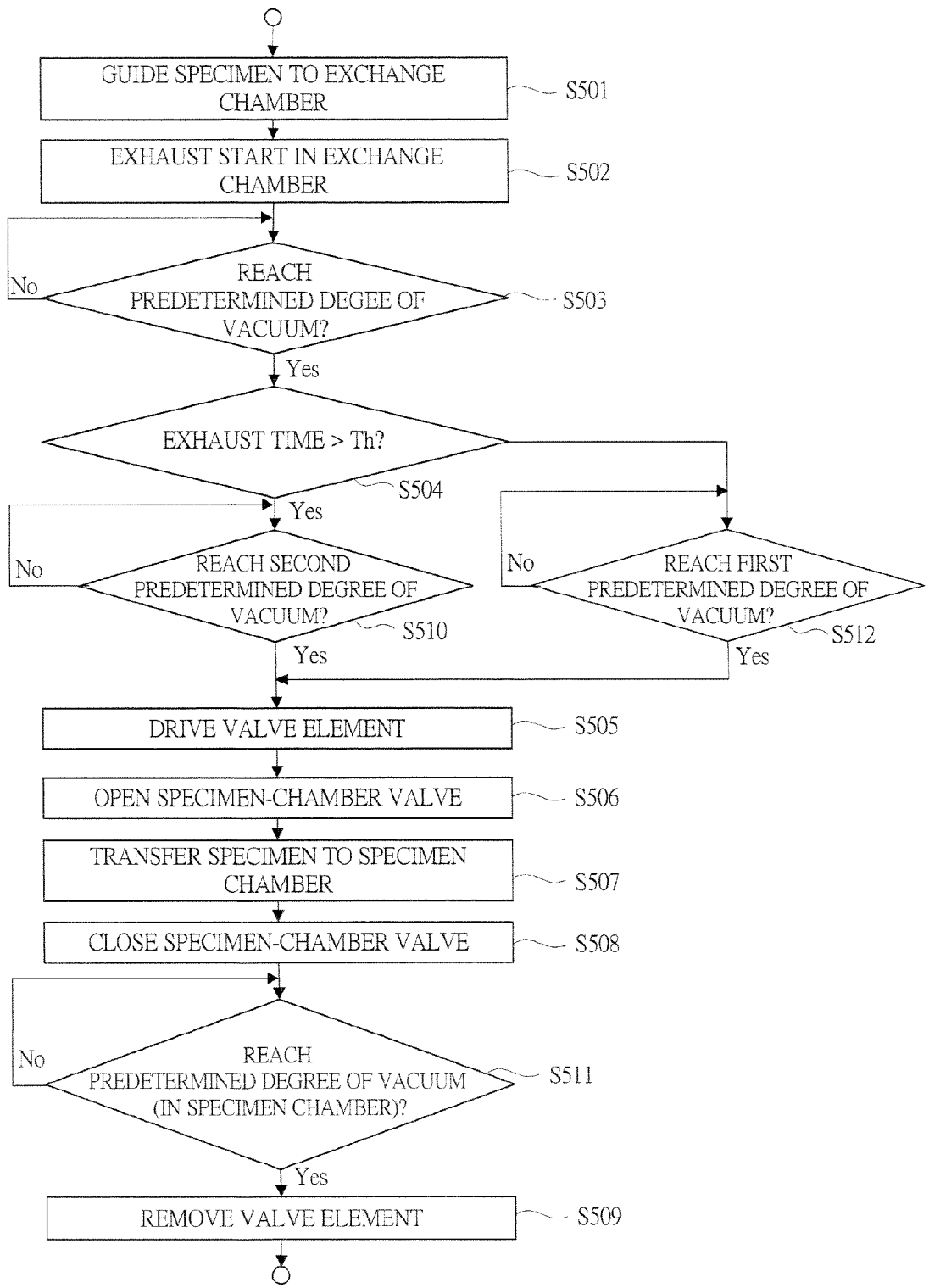

CHARGED PARTICLE BEAM DEVICE

RELATED APPLICATIONS

This application is the U.S. National Phase under 35 U.S.C. §371 International Application No. PCT/JP2013/054224, filed on Feb. 20, 2013, which in turn claims the benefit of Japanese Application No. 2012-046046, filed on Mar. 2, 2012, the disclosures of which Applications are Incorporated by reference herein.

TECHNICAL FIELD

The present invention relates to a charged particle beam device, and, more particularly, relates to a technique effectively applied to a charged particle beam device having a valve element arranged between a preliminary exhaust chamber of the charged particle beam device and a specimen chamber in which a specimen to be exposed to a charged particle beam is placed.

TECHNICAL FIELD

For a charged particle beam device represented by a scanning electron microscope (SEM), it is required to emit a charged particle beam (electron beam in the SEM) onto a specimen under such a state that a specimen chamber (main vacuum chamber) for placing the specimen therein is in a vacuum state. Meanwhile, for a SEM that measures or inspects a semiconductor device, etc., it is recently required to process (measure, inspect) many specimens in a unit time, and a SEM provided with a preliminary exhaust chamber (which may hereinafter be referred to as "load lock chamber") has been proposed as the SEM for the requirement.

In order to enable specimen exchange while keeping the specimen chamber in a high vacuum state, a partition wall is formed between the specimen chamber and the load lock chamber, and the partition wall is provided with an openable valve (which may hereinafter be referred to as "specimen chamber valve"). The vacuum exhaust or leaking is performed in the load lock chamber during the processing in the specimen chamber, so that the processing in the specimen chamber can be continuously performed, and a throughput of the device can be increased (hereinafter, an amount of the specimen processing per unit time, which is one of performance indexes of the device, may be referred to as "throughput").

For the load lock chamber, by providing a vacuum gauge and providing such a sequence as opening a valve when a vacuum value measured by the vacuum gauge reaches a predetermined value or after that, such an arrangement as not opening the valve in a state of large difference in the degree of vacuum between them is made.

Meanwhile, when the specimen chamber valve is opened at the time of specimen exchange, a method in consideration of the throughput is used, the method opening the valve when a pressure difference between the specimen chamber and an exchange chamber reaches a certain value, and exchanging a specimen in the exchange chamber and a specimen in the specimen chamber are exchanged for each other. Although the degree of vacuum of the specimen chamber decreases when the valve is opened, the degree of vacuum of the specimen chamber is recovered to the high vacuum state again by continuing the vacuum exhaust even after the valve is closed.

For example, Patent Document 1 discloses such a device as a scanning electron microscope including a specimen chamber and a load lock chamber each of which is provided with a vacuum gauge.

PRIOR ART DOCUMENT

Patent Document

Patent Document 1: Japanese Patent Application Laid-Open Publication No. 2010-86926

DISCLOSURE OF THE INVENTION

Problems to be Solved by the Invention

Incidentally, if a gas emission volume from the specimen is large in the prior art of the above-described Patent Document 1, the decrease in the degree of vacuum of the specimen chamber when the valve is opened at the time of specimen exchange is large, or the recovery of the degree of vacuum of the specimen chamber after the specimen is transferred to the specimen chamber and the valve is closed takes a long time. Accordingly, in order to treat such a specimen, air is exhausted in the exchange chamber to reach a higher vacuum so as to make a small difference in the degree of vacuum between the specimen chamber and the exchange chamber, and then, the valve is opened, so that the decrease in the degree of vacuum of the specimen chamber is suppressed, and the increase in the time taken for the recovery of the degree of vacuum of the specimen chamber is moderated. However, the exhaust of the air in the exchange chamber to the higher vacuum lengthens exhaust time until the specimen is exchanged in the exchange chamber. Therefore, the exhaust time in the exchange chamber is lengthened even for a specimen whose gas emission volume is small, which results in a cause for decrease in the throughput of the device.

Accordingly, the present invention has been made in order to solve such a problem in the prior art, and a typical preferred aim of the invention is to provide a charged particle beam device that properly maintains a throughput of the device for each of specimens different in gas emission volume from each other.

The above and other preferred aims and novel characteristics of the present invention will be apparent from the description of the present specification and the accompanying drawings.

Means for Solving the Problems

The typical summary of the inventions disclosed in the present application will be briefly described as follows.

(1) A typical charged particle beam device includes: a charged particle source; a specimen stage for holding a specimen to be irradiated with a charged particle beam emitted from the charged particle source; a specimen chamber that turns an atmosphere in which the specimen held by the specimen stage is placed into a vacuum state; a specimen exchange chamber that turns an atmosphere of the specimen to be guided into the specimen chamber into a vacuum state; a vacuum gauge that measures an internal pressure of the specimen exchange chamber; a time measuring unit that measures time taken until a measured result by the vacuum gauge reaches a predetermined degree of vacuum; and an integral control unit that performs comparative calculation and determination based on a measurement result from the time measuring unit and integral control based on a process flow.

The integral control unit has a such a feature as controlling to change a subsequent process content based on a shift of the degree of vacuum of the specimen exchange chamber (e.g., based on vacuum exhaust time in the specimen exchange chamber when the specimen is in the specimen exchange chamber or on a variation of the degree of vacuum of the specimen exchange chamber for a predetermined time interval when the specimen is in the specimen exchange chamber).

(2) Another typical charged particle beam device includes: a charged particle source; a specimen stage for holding a specimen to be irradiated with a charged particle beam emitted from the charged particle source; a specimen chamber that turns an atmosphere in which the specimen held by the specimen stage is placed into a vacuum state; a specimen exchange chamber that turns an atmosphere of the specimen to be guided into the specimen chamber into a vacuum state; a vacuum gauge that measures an internal pressure of the specimen exchange chamber; an information acquiring device that acquires unique information for the specimen; and an integral control unit that performs comparative calculation and determination based on an acquiring information from the information acquiring device and integral control based on a process flow.

And, the integral control unit has such a feature as controlling to change the subsequent process content based on the unique information for the specimen acquired by the information acquiring device (such as information related to the gas emission volume from the specimen)

(3) More specifically, the integral control unit determines a magnitude of the gas emission volume from the specimen based on a shift of the degree of vacuum during the vacuum exhaust when the specimen is in the specimen exchange chamber, and changes the subsequent process so as to be appropriate for each specimen based on a result of the determination.

An aspect for achieving the above-described preferred aim has such a feature as determining that the specimen is a specimen whose gas emission volume is small if vacuum exhaust time in the exchange chamber is short, and completing the exhaust in a short time by using a predetermined set value as a degree of vacuum for determining completion of exchange chamber exhaust, or as determining that the specimen is a specimen whose gas emission volume is large if the vacuum exhaust time is long, and continuing the exhaust up to a high vacuum state by using a set value which brings higher vacuum (representing a lower pressure) than a degree of vacuum of the specimen whose gas emission volume is small as the degree of vacuum for determining completion of the exchange chamber exhaust.

It is determined either that the gas emission volume from the specimen is large or small by comparing time required when the vacuum reaches a previously-set degree of vacuum for determining completion of the exhaust with a previously-set predetermined time.

Effects of the Invention

The effects obtained by typical aspects of the present invention will be briefly described below.

That is, a typical effect can provide a charged particle beam device that properly maintains a throughput of the device for each of specimens different in gas emission volume from each other.

More specifically, by changing a value for determining completion of exchange chamber vacuum exhaust for each of a specimen that emits a large volume of a gas and a specimen that emits a small volume of a gas, stoppage or long suspension of the processing due to a decrease in the degree of vacuum of the specimen chamber is suppressed for the specimen that emits a large volume of a gas, and besides, increase in the exhaust time in the exchange chamber is prevented for the specimen that emits a small volume of a gas, so that the device that appropriately maintains throughput for both specimens can be provided.

Merits of a user are to enable the user to measure a specimen that emits a large volume of a gas, and are enable the user to perform the measurement without distinguishing between the large gas emission volume from the specimen and the small gas emission volume therefrom while preventing a decrease in the throughput of the specimen that emits the small volume of the gas.

BRIEF DESCRIPTIONS OF THE DRAWINGS

FIGS. 6A to 6C are diagrams each illustrating an example of a screen of a display device that displays an adjustment setting and an operation status in the scanning electron microscope of FIG. 1;

FIG. 7 is a diagram illustrating an example of a control process flow of the specimen transfer system and the vacuum exhaust system, which illustrates a modification example of FIG. 4;

Figure 11:
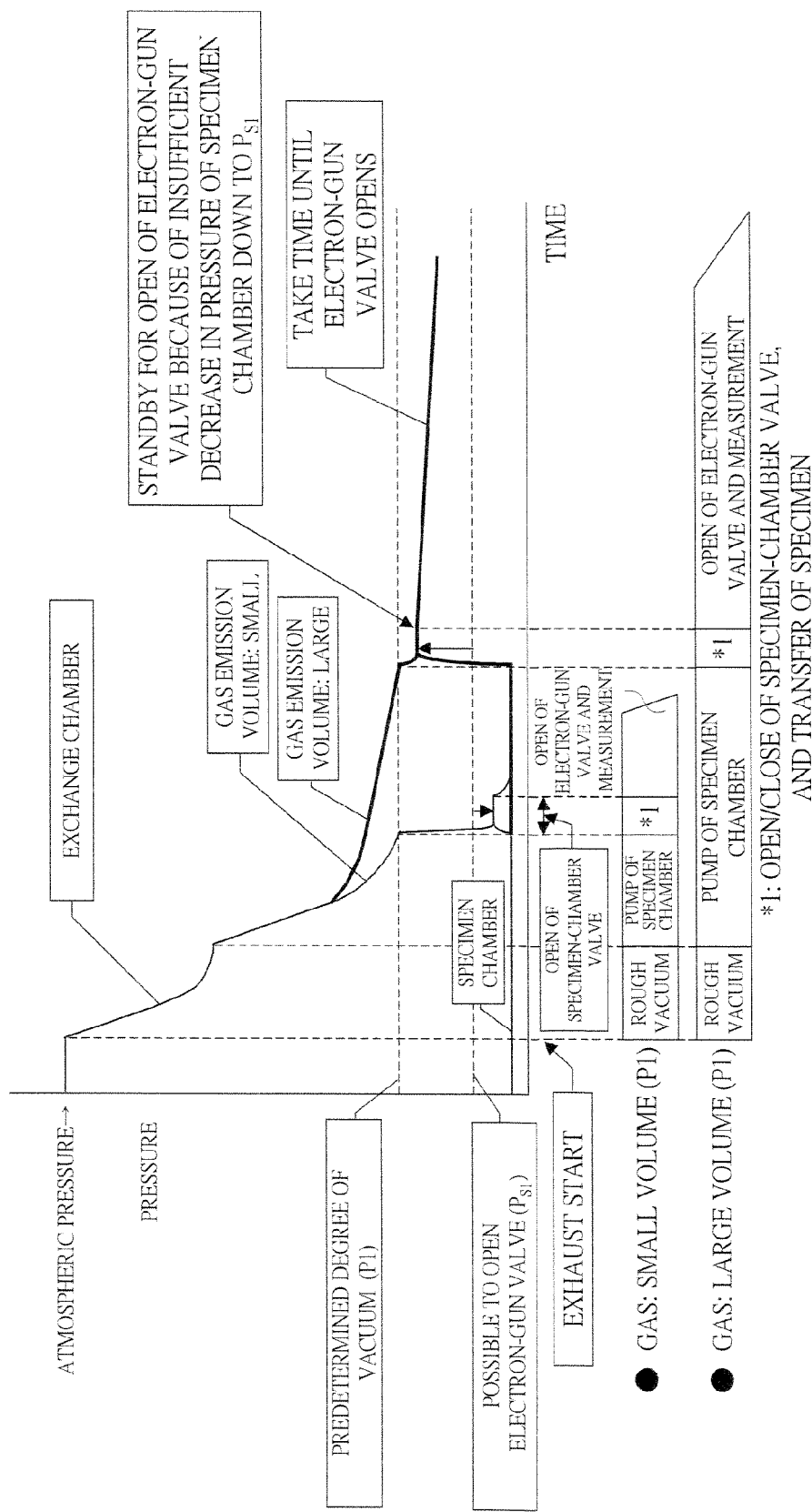
Figure 12:
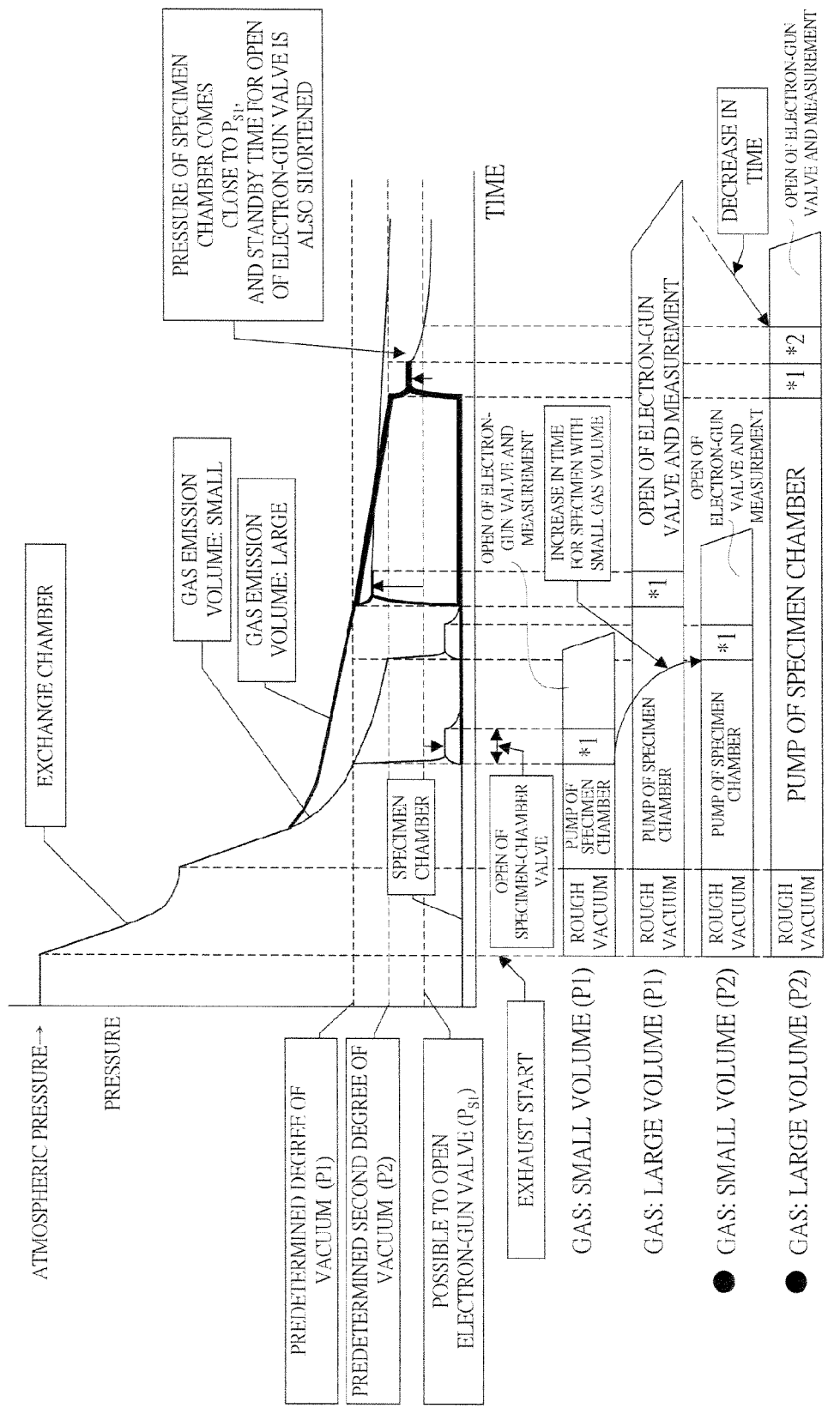

FIG. 11 is a diagram illustrating an example of a shift of the degrees of vacuum of an exchange chamber and a specimen chamber (in a case of a large volume of gas emission) in a scanning electron microscope described as an assumption technique to the present invention; and FIG. 12 is a diagram illustrating an example of a shift of the degrees of vacuum of an exchange chamber and a specimen chamber (in a case in which air is exhausted in the exchange chamber up to a high vacuum state) in a scanning electron microscope described as a premise technique to the present invention.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Summary of Embodiment of Present Invention (1) A charged particle beam device (described with a corresponding component, symbol, and others in parentheses as an example) according to an embodiment of the present invention includes: a charged particle source (electron source 1a); a specimen stage (specimen stage 7) for holding a specimen to be irradiated with a charged particle beam emitted from the charged particle source; a specimen chamber (specimen chamber 9) that turns an atmosphere in which the specimen held by the specimen stage is placed into a vacuum state; a specimen exchange chamber (exchange chamber 10) that turns an atmosphere of the specimen to be guided into the specimen chamber into a vacuum state; a vacuum gauge (vacuum gauge 42) that measures an internal pressure of the specimen exchange chamber; a time measuring unit (time count unit 73) that measures time taken until a measured result by the vacuum gauge reaches a predetermined degree of vacuum; and an integral control unit (integral control unit 78) that performs comparative calculation and determination based on a measurement result from the time measuring unit and integral control based on a process flow.

The integral control unit has a such a feature as controlling to change a subsequent process content based on a shift of the degree of vacuum of the specimen exchange chamber (e.g., based on vacuum exhaust time in the specimen exchange chamber when the specimen is in the specimen exchange chamber or on a variation of the degree of vacuum of the specimen exchange chamber for a predetermined time interval when the specimen is in the specimen exchange chamber).

(2) A charged particle beam device (described with a corresponding component, symbol, and others in parentheses as an example) according to another embodiment of the present invention includes: a charged particle source (electron source 1a); a specimen stage (specimen stage 7) for holding a specimen to be irradiated with a charged particle beam emitted from the charged particle source; a specimen chamber (specimen chamber 9) that turns an atmosphere in which the specimen held by the specimen stage is placed into a vacuum state; a specimen exchange chamber (exchange chamber 10) that turns an atmosphere of the specimen to be guided into the specimen chamber into a vacuum state; a vacuum gauge (vacuum gauge 42) that measures an internal pressure of the specimen exchange chamber; an information acquiring device (information acquiring device 93) that acquires unique information for the specimen; and an integral control unit (integral control unit 78) that performs comparative calculation and determination based on an acquiring information from the information acquiring device and integral control based on a process flow.

And, the integral control unit has such a feature as controlling to change the subsequent process content based on the unique information for the specimen acquired by the information acquiring device (such as information related to the gas emission volume from the specimen).

Hereinafter, one embodiment of the present invention based on the summary of the embodiment of the present invention described above will be described in detail with reference to the accompanying drawings. Note that the same components are denoted by the same reference symbols throughout all of the drawings for describing the embodiment, and the repetitive description thereof will be omitted.

Hereinafter, in order to easily understand the features of the present invention, the premise technique and its problem for the present invention will be explained first, and then, the embodiments of the present invention will be explained in detail. Also, hereinafter, a scanning electron microscope will be explained as one example of a charged particle beam device. However, it is needless to say that the scanning electron microscope can be applied to other devices.

Premise Technique for Present Invention

The premise technique for the present invention will be explained by using FIGS. 1 and 10 to 12.

Along with advancement in microfabrication of a semiconductor device in recent years, increase in further resolution and throughput for a scanning electron microscope that measures or inspects the semiconductor device has been demanded.

Figure 1:
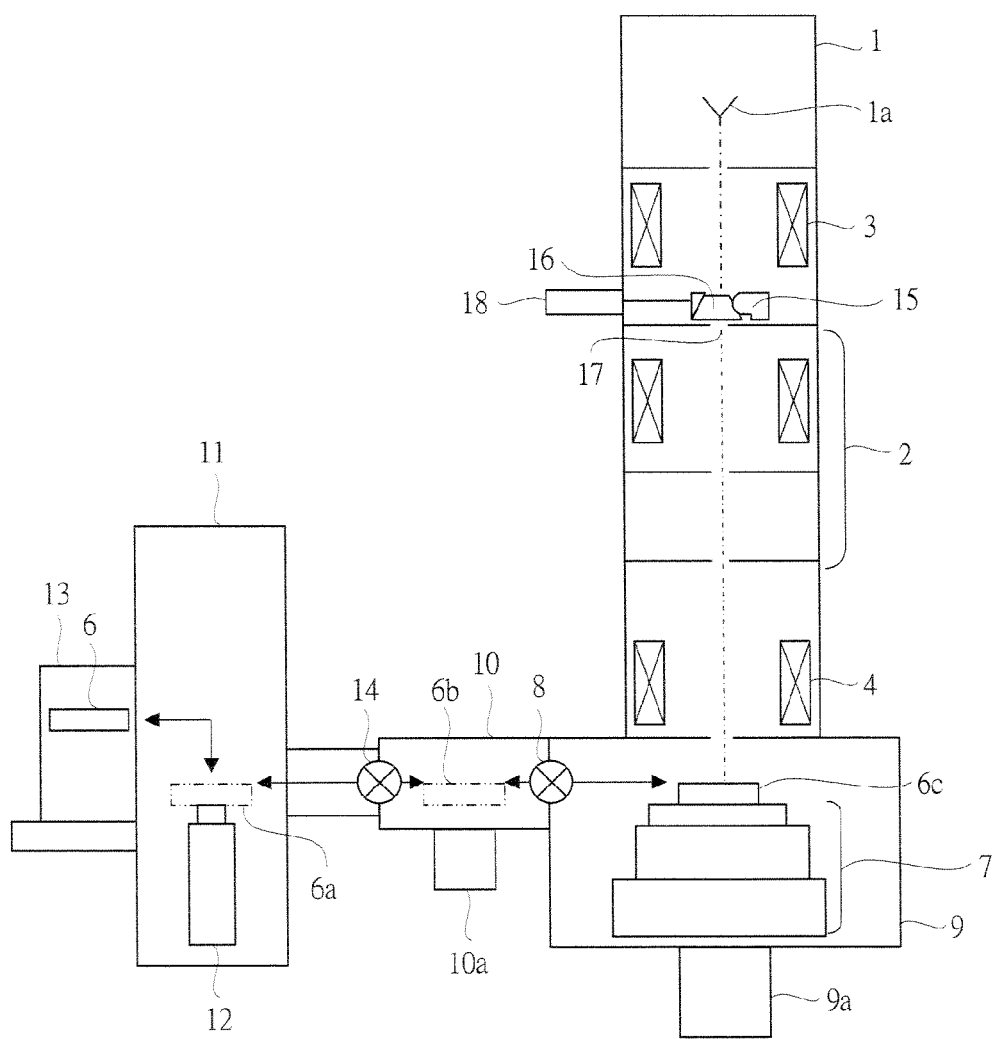
FIG. 1 is a diagram illustrating an example of a schematic configuration of a scanning electron microscope according to a first embodiment of the present invention.

FIG. 1 is a diagram illustrating an example of a schematic configuration of a scanning electron microscope. This configuration of the scanning electron microscope illustrated in FIG. 1 is applied to not only the premise technique of the present invention but also the embodiments of the present invention to be described later. The scanning electron microscope mainly includes an electron gun 1 (electron source 1a), an electron optical system 2, a condenser lens 3, an objective lens 4, an aperture (diaphragm) 17, a specimen chamber 9 (specimen stage 7), an exchange chamber 10, a local exhaust chamber 11 (specimen transfer robot 12), a wafer case 13, each valve (a specimen chamber valve 8 and an exchange chamber valve 14), each pump (a specimen chamber pump 9a and an exchange chamber pump 10a), a valve element receptor 15, a valve element 16, a valve element drive system 18, and others. The scanning electron microscope is connected to a controller that controls the scanning electron microscope. A specimen to be a target for the scanning electron microscope is a wafer 6 (6a to 6c).

An electron beam emitted from the electron gun 1 including the electron source 1a is sharply converged on the wafer 6 through the condenser lens 3 and the objective lens 4. In a deflector (not illustrated), the wafer 6 is scanned with the electron beam. From a scanning area of the electron beam on the wafer 6, secondary electrons (SE) and backscattered electrons (BSE) are emitted, and the scanning electron microscope is provided therein with a detector (not illustrated) for detecting these electrons. Electrons detected by the detector are converted into an optical signal, and is amplified by an amplifier not illustrated. The amplified optical signal is synchronized with a scanning signal of the deflector not illustrated, and is consequently displayed as a two-dimensional image on a display device or stored in a frame memory. A detected signal forms a profile waveform, and can be used for measuring a dimension of a pattern formed on the wafer 6 based on the waveform.

In order to measure the dimension of a fine pattern formed on the wafer 6 and perform defect inspection, it is required to match a target position for the measurement or inspection on the wafer 6 with a beam irradiation position. The specimen stage 7 is supported by a drive mechanism that moves the wafer 6 at least in the X direction and the Y direction (when the optical axis of the electron beam is taken in the Z axis), and can make the movement.

The wafer 6 has the fine pattern edged thereon, and the foreign objects are unfavorable for the wafer, and therefore, the wafer 6 is transferred from a manufacturing apparatus, etc., to the scanning electron microscope so as to be put in the wafer case 13 having higher cleanness than that in the surrounding environment. The wafer 6 is taken out of the wafer case 13 by the specimen transfer robot 12 arranged in the local exhaust chamber 11 in which air is locally exhausted, and is transferred to a device (not illustrated) that determines the direction of the wafer 6a. The wafer 6a whose direction is adjusted by the device stands by on the specimen transfer robot 12 until the wafer is guided into the exchange chamber 10 for performing preliminary exhaust.

Figure 10:
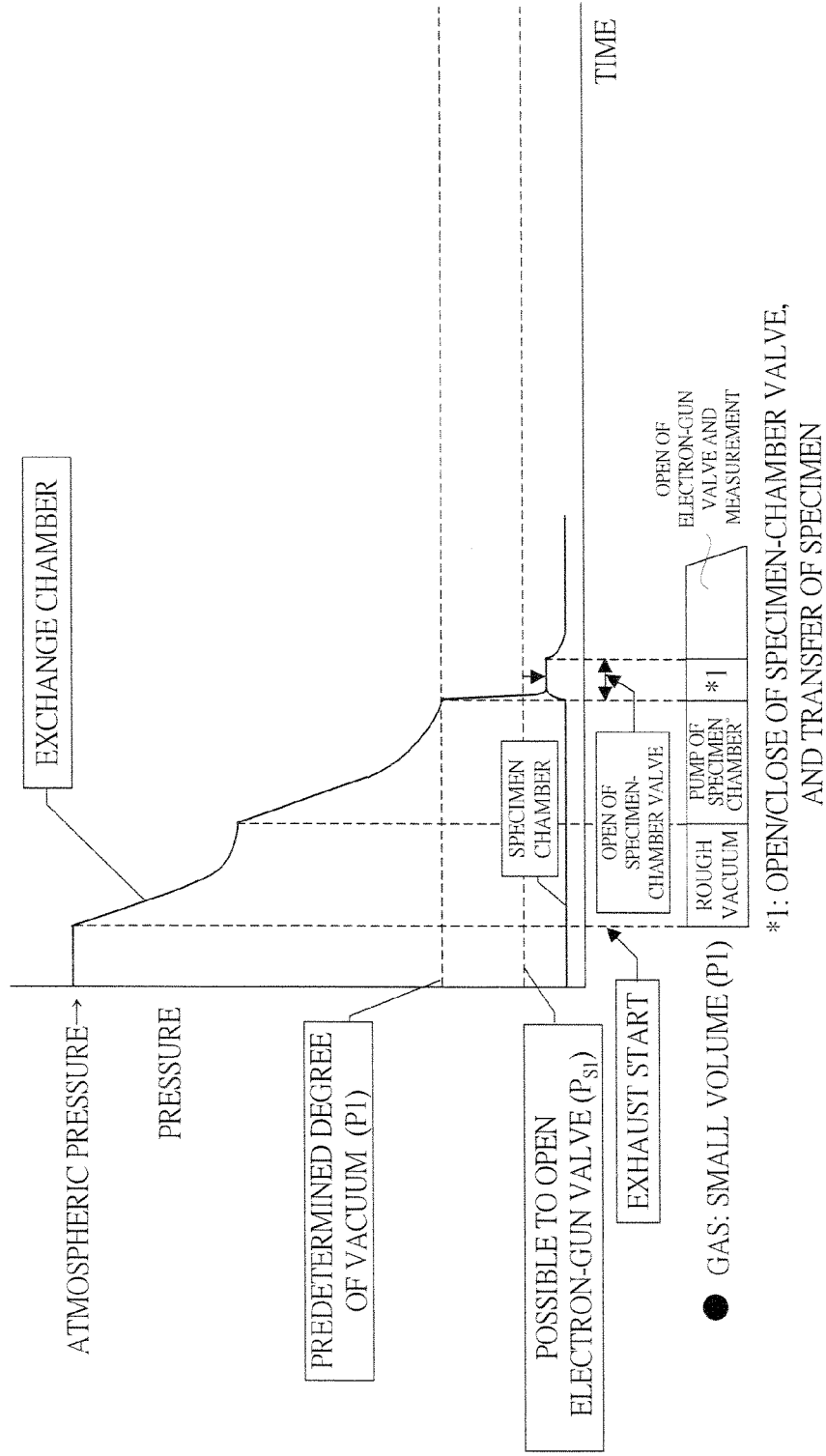
FIG. 10 is a diagram illustrating an example of a shift of the degrees of vacuum of an exchange chamber and a specimen chamber (in a case of a small volume of gas emission) in a scanning electron microscope described as an assumption technique to the present invention.

The exchange chamber 10 in which the specimen can be transferred between an atmospheric space and a vacuum space is provided with two valves which are the specimen chamber valve 8 and the exchange chamber valve 14 and which are opened selectively at the time of specimen transfer. An operation performed to guide the wafer 6a into the specimen chamber 9 will be described with reference to FIG. 10. FIG. 10 is a diagram illustrating an example of a shift of the degrees of vacuum of the exchange chamber 10 and the specimen chamber 9 in the scanning electron microscope, and illustrates a shift of the degrees of vacuum in a course of the specimen transfer process. Note that the degree of vacuum of the exchange chamber 10 obtained after the specimen chamber valve 8 is closed is omitted. In FIG. 10, the horizontal axis represents time and the vertical axis represents pressure, a predetermined degree of vacuum representing a pressure smaller than the atmospheric pressure is denoted as P1, and a degree of vacuum which is further smaller than the pressure and at which the electronic gun valve can be opened is denoted as $P_{s1}$.

When the wafer 6a is guided into the exchange chamber 10, a state of the exchange chamber 10 is in an atmospheric condition first, and then, the exchange valve 14 is opened, and the wafer 6a is guided into the exchange chamber 10 by the specimen transfer robot 12. After the wafer 6b into t is guided into the exchange chamber 10, the exchange valve 14 is closed, and the exchange chamber 10 is subjected to vacuum exhaust. In the vacuum exhaust, a roughing vacuum pump not illustrated is used first to vacuum the air to cause a certain pressure (rough vacuum section in FIG. 10), and then, the pump is switched to the exchange chamber pump 10a to continue the vacuum exhaust so as to bring the degree of vacuum to the degree of vacuum in the specimen chamber 9 (exchange chamber pump section in FIG. 10).

At this time, in consideration of the throughput, when a difference in the pressure between the specimen chamber 9 and the exchange chamber 10 reaches a certain value (for example, when the difference in the pressure is $10^2$ Pa or lower (which is three-digit difference in the pressure at maximum)), the specimen chamber valve 8 is opened, and the wafer 6b placed in the exchange chamber 10 and a wafer 6c placed in the specimen chamber 9 are exchanged for each other. After the wafer exchange, the specimen chamber valve 8 is closed (specimen chamber valve opening/closing and specimen transfer section in FIG. 10). After the specimen chamber valve 8 is closed, the specimen chamber pump 9a is used to maintain the vacuum pressure of the specimen chamber 9.

As described above, since the specimen chamber valve 8 is opened before the pressures of the specimen chamber 9 and the exchange chamber 10 match with each other in consideration of the throughput, the pressure of the specimen chamber 9 increases temporarily (the degree of vacuum decreases).

Meanwhile, it is required to keep inside of the electron gun 1 in a high vacuum state in order to protect the electron gun 1 and ensure the stability of an electron beam. A partition wall for keeping atmosphere surrounding the electron source 1a in the high vacuum state is arranged between the electron source 1a and the specimen chamber 9, and the partition wall is provided with an aperture (diaphragm 17) for allowing the electron beam to pass therethrough. Because of existence of the diaphragm 17, spaces reaching the electron gun 1 in the specimen chamber 9 communicate with each other. A pressure difference is created between the atmosphere of the electron source 1a and the atmosphere in the specimen chamber 9 in a differential exhaust structure. However, both positions of a chip of the electron source 1a and the diaphragm 17 are on the electron beam optical axis (on an ideal optical axis obtained when the electron beam is not polarized), and the specimen chamber 9 is positioned on the electron beam optical axis. That is, the vacuum fluctuation in the specimen chamber 9 may affect on the electron source 1a.

As described above, the early open of the specimen chamber valve 8 for improving the throughput causes the pressure fluctuation in the specimen chamber 9, and therefore, the performance of the electronic source 1a may decrease. To prevent this, a method is used, the method moderating the effect of on the electron source 1a based on the pressure fluctuation in the specimen chamber 9 by providing a cutoff mechanism (the valve element receptor 15, the valve element 16, the valve element drive system 18) for cutting off the atmosphere in the chamber of the electron gun 1 from the atmosphere in the specimen chamber 9. At the decrease in the degree of vacuum of the specimen chamber 9 or the specimen exchange having such a possibility as the decrease in the degree of vacuum of the specimen chamber 9, the cutoff mechanism cuts off communication between the chamber of the electron gun 1 and the specimen chamber 9. At the specimen exchange, the wafer 6c is transferred to the specimen chamber 9, and then, the cutoff mechanism opens for the measurement (image observation, length measurement) after the specimen chamber 9 is in a predetermined high vacuum state. During the cutting off, the electron beam is also cut off, and therefore, the image cannot be observed. Therefore, the image cannot be observed during continuing the decrease in the degree of vacuum of the specimen chamber 9 after the specimen exchange, and therefore, the processing by the device is suspended until the degree of vacuum increases.

FIG. 11 illustrates an example of a shift of the degrees of vacuum in the case of a large volume of gas emission from the specimen in comparison with FIG. 10. In FIG. 11, a shift of the degrees of vacuum in the case of a large volume of gas emission from the specimen is indicated by a thicker line than a thin line indicating the case of a small volume of gas emission from the specimen. In the case of a large volume of gas emission from the specimen, at the specimen exchange (specimen chamber valve opening/closing and specimen transfer section in FIG. 11), the decrease in the degree of vacuum of the specimen chamber 9 caused when the specimen chamber valve is opened is large, or the recovery of the degree of vacuum of the specimen chamber 9 takes a long time after the specimen is transferred to the specimen chamber 9 and the valve is closed. In other words, the pressure of the specimen chamber 9 does not decrease lower than the degree of vacuum $P_{s1}$ at which the electronic gun valve can be opened, and the opening of the electron gun valve has to be waited.

FIG. 12 is a diagram illustrating an example of a shift of the degrees of vacuum in the case in which the exchange chamber 10 is exhausted so as to reach a high vacuum state in comparison with FIG. 11. In FIG. 12, a shift of the degrees of vacuum in the case of a large volume of gas emission from the specimen is indicated by a thicker line than the thick line indicated in FIG. 11. Also, in FIG. 12, a predetermined degree of vacuum which is smaller than the atmospheric pressure is denoted by P1, a second predetermined degree of vacuum which is further smaller is denoted by P2, and a degree of vacuum which is still further smaller and at which the electronic gun valve can be opened is denoted by $P_{s1}$.

According to the study made by the inventors, it has been found out that, for the specimen that emits a large volume of a gas, the decrease in the degree of vacuum of the specimen chamber 9 can be suppressed and the increase in the time taken for the recovery of the degree of vacuum of the specimen chamber 9 can be moderated by exhausting the air in the exchange chamber 10 to be in the high vacuum state so that the difference in the degree of vacuum between the specimen chamber 9 and the exchange chamber 10 is small, and then, opening the valve. Further, in the case of a specimen that emits a large volume of a gas, it has been found out that, although the exhaust time in the exchange chamber 10 is lengthened by exhausting the air in the exchange chamber 10 to be in the high vacuum state, the exhaust time in the specimen chamber 9 taken after the specimen is transferred can be shortened, and therefore, the total of the exhaust time in the exchange chamber 10 and in the specimen chamber 9 can be shortened.

However, the exhaust in the exchange chamber 10 to be in the high vacuum state lengthens the exhaust time in the exchange chamber 10 also for the specimen that emits a small volume of a gas. In the specimen that emits a small volume of a gas, the degree of vacuum of the specimen chamber 9 after the transfer to the specimen chamber 9 can be originally recovered in a short time. Therefore, even if the exhaust time in the exchange chamber 10 is lengthened, the exhaust time in the specimen chamber 9 cannot be reduced so much. For this reason, in the specimen that emits a small volume of a gas, the total of the exhaust time in the exchange chamber 10 and in the specimen chamber 9 is lengthened by the lengthened exhaust time in the exchange chamber 10, which results in the decrease in the throughput of the device.

Therefore, hereinafter, embodiments of the present invention will be described in detail with reference to drawings with regard to a scanning electron microscope enabling both of the suppression of a decrease in the degree of vacuum and increase in time taken for recovering the degree of vacuum in the specimen chamber 9 in the specimen that emits a large volume of a gas, and prevention of increase in exhaust time in the exchange chamber 10 in the specimen that emits a small volume of a gas.

Embodiments of Present Invention

Embodiments of the present invention will be described with regard to a scanning electron microscope which can change a subsequent process so as to be appropriate for each specimen based on a result of determination indicating that the gas emission volume from a specimen is either large or small from vacuum exhaust time taken when the specimen is in the exchange chamber 10 at the specimen exchange.

According to one of the embodiments of the present invention, the suppression of stoppage or long suspension of the processing due to the decrease in the degree of vacuum for the specimen that emits a large volume of a gas and the prevention of the increase in exhaust time for the specimen that emits a small volume of a gas can be both achieved, and therefore, the device that is appropriate for both specimens and maintains the throughput can be provided.

A scanning electron microscope that determines the gas emission volume from a specimen is either large or small and that can change a subsequent process so as to be appropriate for each specimen will hereinafter be described with reference to drawings. Note that the scanning electron microscope is described as an example of a charged particle beam device in the embodiments. However, the embodiments can be also applied to a device having a beam source may be affected by a change in the degree of vacuum of a specimen chamber. As another example of the charged particle beam device, a focused ion beam device, etc., is cited.

First Embodiment

A first embodiment will be described with reference to FIGS. 1 to 8. This embodiment mainly describes a method of transfer and vacuum exhaust of specimens different in gas emission volume from each other. The configuration, basic operation, and others of another type of scanning electron microscope are the same as those of the above-described premise technique to the present invention, and are therefore omitted here.

The scanning electron microscope of the present embodiment has the same configuration as that exemplified in FIG. 1 described above, and mainly includes an electron gun 1 including an electron source 1a, an electron optical system 2, a condenser lens 3, an objective lens 4, an aperture (diaphragm) 17, a specimen chamber 9 housing a specimen stage 7, an exchange chamber 10, a local exhaust chamber 11 housing a specimen transfer robot 12, a wafer case 13 housing a wafer 6, each valve and each pump, a valve element receptor 15, a valve element 16, a valve element drive system 18, and others. Each valve includes a specimen chamber valve 8 arranged between the specimen chamber 9 and the exchange chamber 10, an exchange chamber valve 14 arranged between the exchange chamber 10 and the local exhaust chamber 11, and others. Each pump includes a specimen chamber pump 9a arranged in the specimen chamber 9, an exchange chamber pump 10a arranged in the exchange chamber 10, and others.

Figure 2:
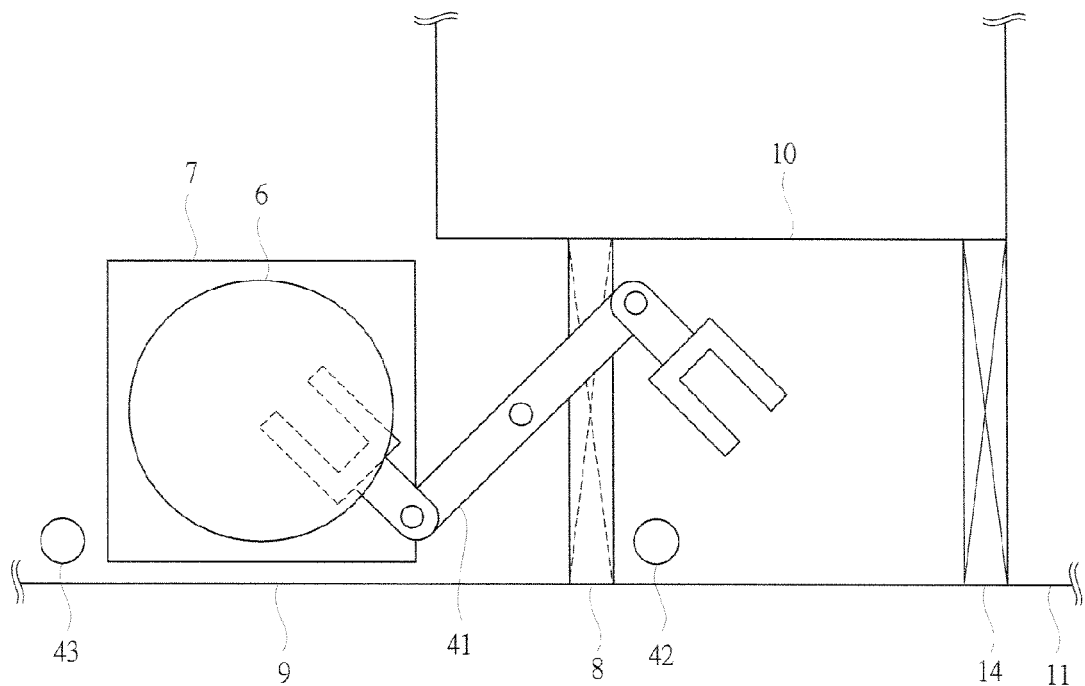
FIG. 2 is a diagram illustrating an example of a top view of a specimen transfer system in the scanning electron microscope of FIG. 1.

FIG. 2 is a diagram illustrating an example of a top view of a specimen transfer system in the scanning electron microscope of FIG. 1. FIG. 2 illustrates a specimen transfer robot 41, a vacuum gauge 42, and a vacuum gauge 43, in addition to the configuration of FIG. 1. The specimen transfer robot 41 is housed in the specimen chamber 9 and transfers the wafer 6 between the specimen chamber 9 and the exchange chamber 10. The vacuum gauge 42 is arranged in the exchange chamber 10, while the vacuum gauge 43 is arranged in the specimen chamber 9. The vacuum gauges gauge the degrees of vacuum (pressures) of the respective chambers.

In the scanning electron microscope having the above configuration, a specimen transfer system and a vacuum exhaust system, which include the specimen transfer robot 12, the specimen chamber valve 8, the exchange chamber valve 14, the specimen chamber pump 9a, the exchange chamber pump 10a, and the valve element drive system 18, and other, are connected to a controller described later (in FIG. 3) and are controlled by the controller.

<Configuration of Controller>

Figure 3:
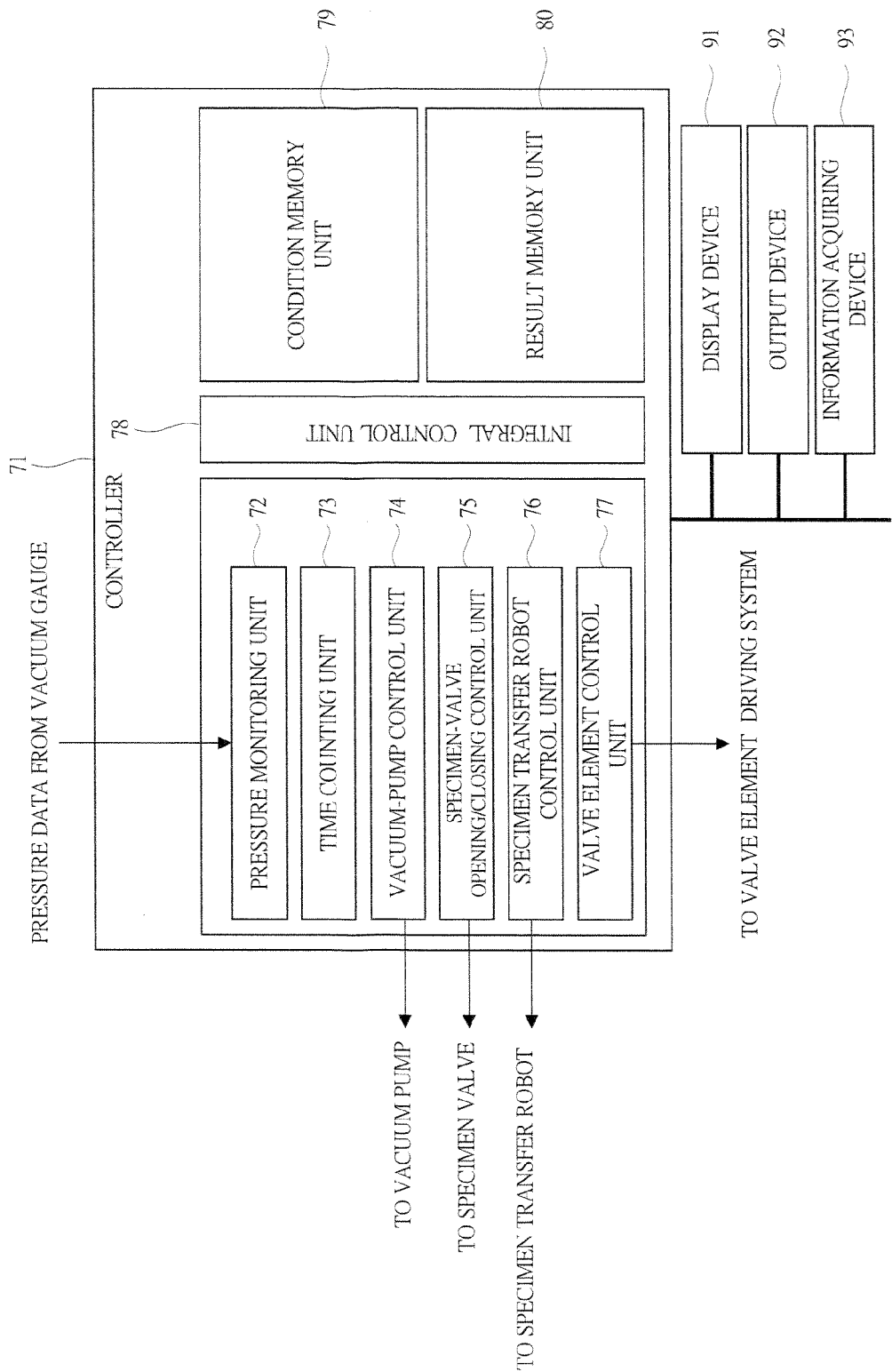
FIG. 3 is a diagram illustrating an example of a schematic configuration of a controller that controls the specimen transfer system and a vacuum exhaust system in the scanning electron microscope of FIG. 1.

The specimen transfer system and the vacuum exhaust system of the scanning electron microscope exemplified in FIG. 1 are controlled by the controller exemplified in FIG. 3. FIG. 3 is a diagram illustrating an example of a schematic configuration of the controller that controls these specimen transfer system and vacuum exhaust system. The controller 71 exemplified in FIG. 3 mainly includes a pressure monitoring unit 72, a time counting unit 73, a vacuum pump control unit 74, a specimen valve opening/closing control unit 75, a specimen transfer robot control unit 76, a valve element control unit 77, an integral control unit 78, and a condition memory unit 79 that stores therein control conditions for these control units. Depending on the form of use of the scanning electron microscope, the controller 71 may further include a result memory unit 80 that stores therein operation results.

The pressure monitoring unit 72 is a functional unit that is connected to the vacuum gauges 42 and the vacuum gauge 43 arranged in the exchange chamber 10 and the specimen chamber 9, respectively, and that monitors pressure data obtained by each vacuum gauge. The time counting unit 73 is a functional unit that counts a time that each of the exchange chamber 10 and specimen chamber 9 reaches a predetermined degree of vacuum. The vacuum pump control unit 74 is a functional unit that is connected to the specimen chamber pump 9a and the exchange chamber pump 10a and that controls each vacuum pump based on a predetermined condition. The specimen valve opening/closing control unit 75 is a functional unit that is connected to the specimen chamber valve 8 and the exchange chamber valve 14 and that controls opening/closing of each valve at predetermined timing. The specimen transfer robot control unit 76 is a functional unit that is connected to the specimen transfer robot 12 which transfers a specimen between the local exhaust chamber 11 and the exchange chamber 10 and to the specimen transfer robot 41 which transfers a specimen between the exchange chamber 10 and the specimen chamber 9, and that controls each specimen transfer robot. The valve element control unit 77 is a functional unit that is connected to the valve element drive system 18 which is exemplified in FIG. 1 and which drives the valve element 16 to press it to the valve element receptor 15 so as to close the aperture of the diaphragm 17, and that controls the valve element drive system 18. The integral control unit 78 is a functional unit that performs overall integral control including comparative calculation and control based on a determination and a process flow.

The controller 71 is connected also to a display device 91 that displays adjustment settings and operation statuses as illustrated in FIG. 6 described later, and to an output device 92 that outputs the display contents of the display device 91 to outside of the device.

<Control Process for Specimen Transfer System and Vacuum Exhaust System>

Figure 4:
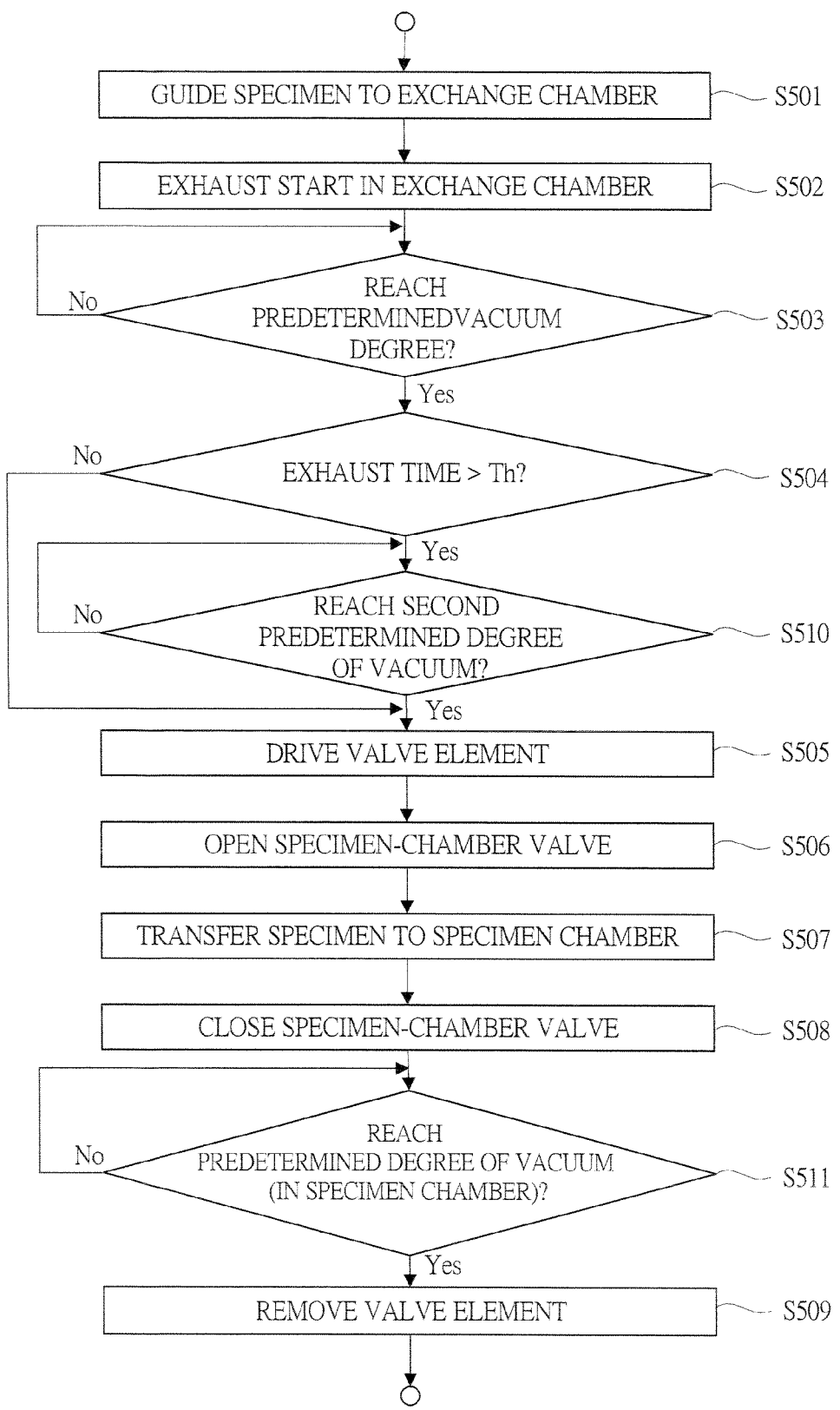
FIG. 4 is a diagram illustrating an example of a control process flow of the specimen transfer system and the vacuum exhaust system in the scanning electron microscope of FIG. 1.
Figure 5:
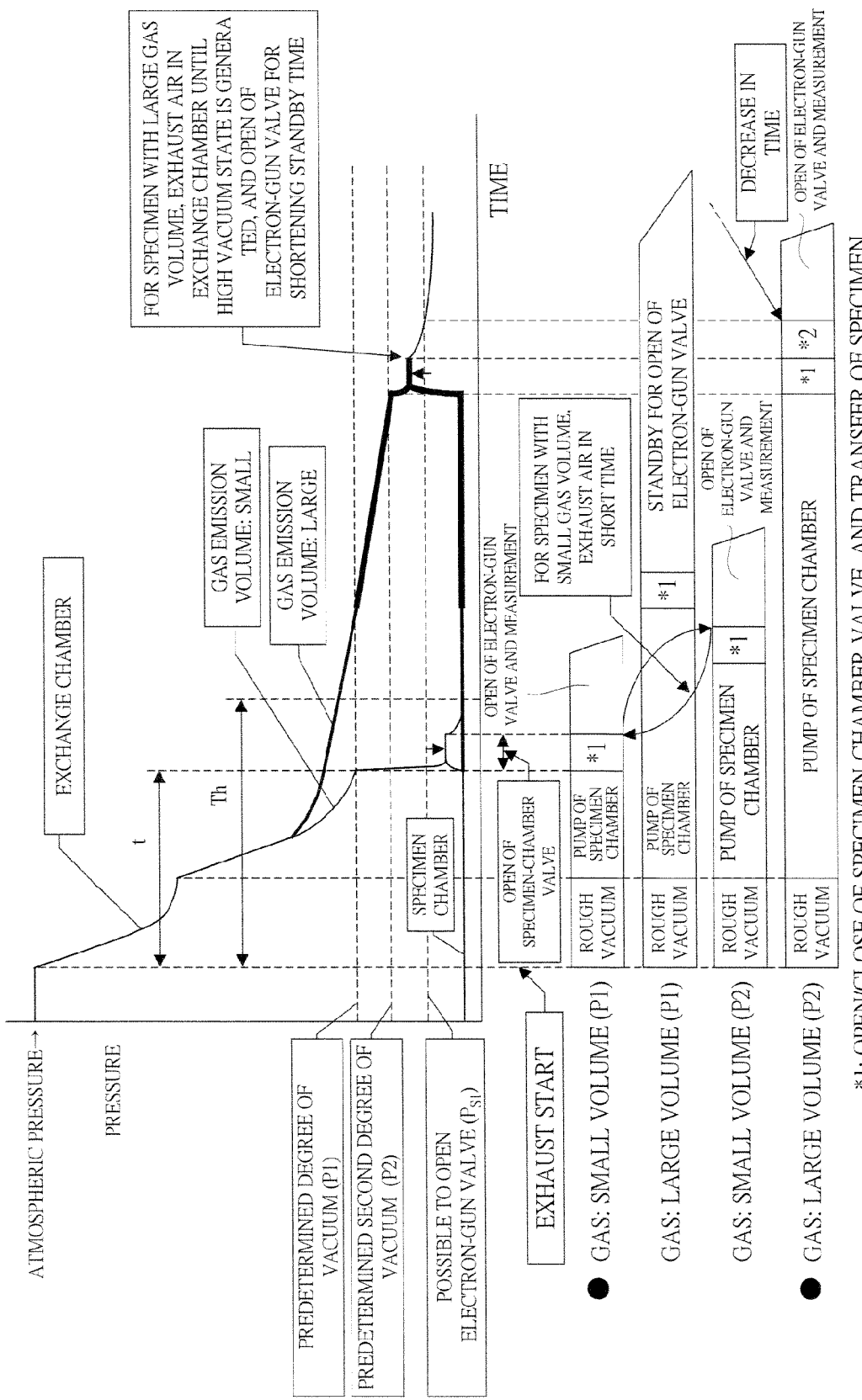
FIG. 5 is a diagram illustrating an example of a shift of the degrees of vacuum of an exchange chamber and a specimen chamber in the scanning electron microscope of FIG. 1.

A specific control method executed by the controller 71 exemplified in FIG. 3 will be described with reference to FIG. 4 illustrating an example of a control process flow for the specimen transfer system and the vacuum exhaust system of the scanning electron microscope and to FIG. 5 illustrating an example of a shift of the degrees of vacuum of the exchange chamber and the specimen chamber of the scanning electron microscope. Also, FIG. 2 illustrating an example of a top view of the specimen transfer system of the scanning electron microscope is also used. As the overall control in the control process flow for the specimen transfer system and the vacuum exhaust system of the scanning electron microscope as exemplified in FIG. 4, the overall control is performed by the integral control unit 78 of the controller 71.

The specimen valve opening/closing control unit 75 controls the exchange chamber valve 14 to open it, and then the specimen transfer robot 12 controlled by the specimen transfer robot control unit 76 transfers (guides) the wafer (specimen) 6a into the exchange chamber 10 (step S501). Subsequently, the vacuum pump control unit 74 controls the exchange chamber pump 10a to cause it to start vacuum exhaust in the exchange chamber 10 (step S502). Then, the pressure monitoring unit 72 monitors the internal pressure of the exchange chamber 10 through the vacuum gauge 42 arranged in the exchange chamber 10 as exemplified in FIG. 2, and determines whether the internal pressure of the exchange chamber 10 has reached a predetermined pressure (degree of vacuum P1) (step S503). As a result of the determination, if the internal pressure of the exchange chamber 10 has not reached the predetermined pressure (step S503—No), the determination process at step S503 is repeated. If the internal pressure of the exchange chamber 10 has reached the predetermined pressure (step S503—Yes), the process flow proceeds to the next step S504.

At the next step S504, based on a vacuum reaching time measured by the time counting unit 73, it is determined whether a vacuum exhaust time in the exchange chamber 10 has exceeded a predetermined value Th. As a the result of the determination, if the vacuum exhaust time has exceeded the predetermined value Th (S504—Yes), vacuum exhaust in the exchange chamber 10 is continued as the internal pressure is monitored, and it is determined whether the internal pressure of the exchange chamber 10 has reached a second predetermined pressure (the degree of vacuum P2 higher than the degree of vacuum P1 (lower pressure)) (step S510). As a result of the determination, if the internal pressure of the exchange chamber 10 has not reached the second predetermined pressure (S510—No), the determination at step S510 is repeated. If the internal pressure of the exchange chamber 10 has reached the second predetermined pressure (S510—Yes), the process flow proceeds to the next step S505. If it is determined at step S504 that the vacuum exhaust time has not exceeded the predetermined value Th (S504—No), step S510 is not executed and the process flow proceeds to step S505.

At step S505, in order to prevent the effect of fluctuation of the degree of vacuum of the specimen chamber 9 on the electron gun 1, the valve element control unit 77 drives the valve element 16 to move it. Then, the specimen chamber valve 8 is opened under control by the specimen valve opening/closing control unit 75 (step S506), and the wafer 6b is transferred into the specimen chamber 9 under control by the specimen transfer robot control unit 76 (step S507), and the specimen chamber valve 8 is closed (step S508).

Subsequently, the pressure monitoring unit 72 monitors the internal pressure of the specimen chamber 9 through the vacuum gauge 43 arranged in the specimen chamber 9, and it is determined whether the internal pressure of the specimen chamber 9 has reached a predetermined pressure (degree of vacuum $P_{s1}$ higher than the degree of vacuum P2 (lower pressure)) (step S511). As a result of the determination, if the internal pressure of the specimen chamber 9 has not reached the predetermined pressure (S511—No), the determination at step S511 is repeated. If the internal pressure of the specimen chamber 9 has reached the predetermined pressure (S511—Yes), the process flow proceeds to the next step S509. At the step S509, the valve element 16 is moved (removed) to open an electron beam path.

In the above manner, the control process for controlling the specimen transfer system and the vacuum exhaust system is performed under control by the controller 71 so that, if the vacuum exhaust time taken when the wafer 6 is in the exchange chamber 10 is long at the specimen exchange, the wafer 6 is determined to be a wafer that emits a large volume of a gas, the exhaust is continued so as to cause the high vacuum state, and so that, if the vacuum exhaust time is short, the wafer 6 is determined to be a wafer that emits a small volume of a gas, and a predetermined set value is used as a degree of vacuum for determining exhaust completion at the exchange chamber 10 to complete the vacuum exhaust in a short time.

<Screen of Display Device Displaying Adjustment Settings and Operation Statuses>

FIGS. 6A to 6C are diagrams each illustrating an example of a screen of the display device 91 displaying adjustment settings and operation statuses in the scanning electron microscope. Screens on which the display device 91 displays adjustment settings and operation statuses include a screen of FIG. 6A for inputting or displaying settings thereon, a screen of FIG. 6B for displaying results thereon, and a screen of FIG. 6C for displaying a shift graph of the degree of vacuum thereon. The display device 91 connected to the controller 71 of this embodiment may display these screens.

In the setting screen of FIG. 6A, items displayed on each screen are exemplified as various items such as "selection", "name", "process", "pressure", and "time" are. The degrees of vacuum for determining vacuum exhaust completion and degrees of vacuum at vacuum exhaust completion are set for the pressure, and the vacuum exhaust time which is a criteria for the determination is set for the time item. The result display screen of FIG. 6B has the various items of "selection", "name", "process", "pressure", and "time", and items of "specimen chamber degree of vacuum after the specimen chamber valve is opened", which is stored in the result memory unit 80, and "time taken until the electron gun valve is opened", based on numbers (No.). The degree of vacuum shift graph display screen of FIG. 6C displays a shift of degrees of vacuum, etc. And, the display may be made in association with the names of specimens that indicate their types.

These display contents may be outputted to outside of the device by the output device 92 connected to the controller 71.

<Modification Example of First Embodiment>

Figure 8:
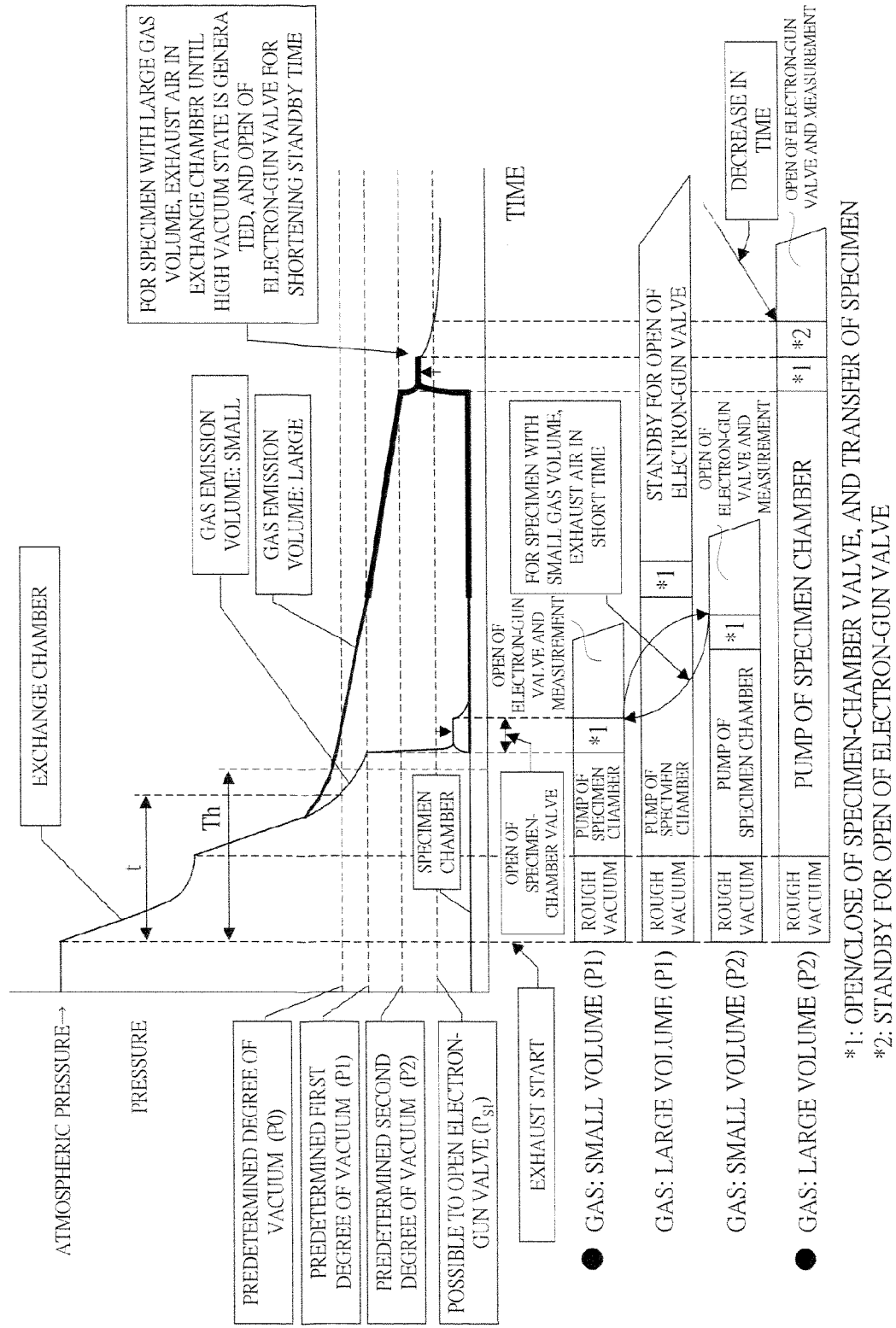
FIG. 8 is a diagram illustrating an example of a shift of the degrees of vacuum of the exchange chamber and the specimen chamber, which illustrates a modification example of FIG. 5.

A modification example of the first embodiment will be described with reference to FIGS. 7 and 8. FIG. 7 is a diagram illustrating an example of a control process flow for the specimen transfer system and the vacuum exhaust system of the scanning electron microscope, illustrating a modification example of FIG. 4. FIG. 8 is a diagram illustrating an example of a shift of the degrees of vacuum of the exchange chamber and the specimen chamber of the scanning electron microscope, illustrating a modification example of FIG. 5.

In the first embodiment, at step S504 of FIG. 4, the same value as the value of the first degree of vacuum at vacuum exhaust completion is used for the degree of vacuum for determining vacuum exhaust completion. However, different values maybe used for them. For example, as illustrated in FIGS. 7 and 8, when the internal pressure of the exchange chamber 10 has reached a predetermined degree of vacuum (P0) for determining vacuum exhaust completion (S503—Yes), it is determined whether a vacuum exhaust time has exceeded the predetermined value Th (step S504). As a result of the determination, the first degree of vacuum (P1) at vacuum exhaust completion is used for determining vacuum exhaust completion if the vacuum exhaust time has not exceeded the predetermined value Th (S504—No), or the second degree of vacuum (P2) at vacuum exhaust completion higher than the first degree of vacuum at vacuum exhaust completion is used if the vacuum exhaust time has exceeded the predetermined value Th (S504—Yes).

By using each of the degrees of vacuum at vacuum exhaust completion, it is determined whether the degree of vacuum in the exchange chamber 10 has reached the first predetermined degree of vacuum (p1) (step S512) and it is determined whether the degree of vacuum in the exchange chamber 10 has reached the second predetermined degree of vacuum (p2) (step S510). As results of the determinations, if the internal pressure of the exchange chamber 10 has reached the first predetermined degree of vacuum (p1) (S512—Yes) and if the internal pressure of the exchange chamber 10 has reached the second predetermined degree of vacuum (p2) (S510—Yes), the process flow proceeds to the next step S505. Subsequent steps are the same as steps described in FIG. 4.

An approximation formula of a shift of degrees of vacuum may be obtained from several points of time and the measured degrees of vacuum so that a vacuum exhaust time, etc., is estimated and determined by calculation, and the degree of vacuum at vacuum exhaust completion may be determined.

Step S504 is described as an example in which it is determined whether the vacuum exhaust time in the exchange chamber 10 has exceeded the predetermined value Th. This determination, however, may be replaced with an item as long as being related to the gas emission volume from the specimen. As other example, it may be determined whether a variation of the degree of vacuum in the exchange chamber 10 per unit time has exceeded a predetermined value, pressures and time at several passing points may be compared with a predetermined value, or a shift range of time-versus-degree of vacuum may be divided into several zones and compared.

Combinations of vacuum exhaust times and degrees of vacuum at vacuum exhaust completion may be registered in a database and maybe used as reference data.

The selective use from the previously-set degree of vacuum at vacuum exhaust completion has been described above. However, a degree of vacuum at vacuum exhaust completion may be calculated from the measured vacuum exhaust time and others.

Not a single value but a plurality of values may be provided as a predetermined value which is the comparison criteria, and levels of the gas emission volume from the specimen may be classified into a plurality of levels so as to determine a degree of vacuum at vacuum exhaust completion.

The scanning electron microscope may have such a learning function as updating a predetermined value which is the comparison criteria to a new value based on information of a previously measured vacuum exhaust time, of a degree of vacuum at vacuum exhaust completion for the exchange chamber 10 selected or obtained based on the measured vacuum exhaust time, and of a margin between the pressure for determining the electron gun valve element removal and the degree of vacuum of the specimen chamber 9 after the opening of the specimen chamber valve which is the result of the degree of vacuum.

There is a tendency of contradiction in increase/decrease between the exchange chamber exhaust time and the time taken until the electron gun valve element removal after the opening of the specimen chamber valve. For this reason, the margin between the pressure for determining the electron gun valve element removal and the degree of vacuum of the specimen chamber 9 which is the determination criteria used for the above-described learning function may be replaced with an item of reduction in the sum of (exchange chamber exhaust time) and (time taken until the electron gun valve element removal after the opening of the specimen chamber valve), that is, an item of shortening of the time taken from the start of exchange chamber vacuum exhaust to the opening of the electron gun valve.

A degree of vacuum at exhaust completion is switched by the determination based on the shift of the degree of vacuum of the exchange chamber 10. Based on such a determination, a report may be sent to a superior control unit not illustrated, a warning may be issued or recorded when the exhaust time takes longer than the predetermined time or it is predicted that the exhaust time takes longer, or the processing may be suspended.

An exhaust completion time may be predicted from the measured exhaust time, and may be displayed or reported.

Determination information of the gas emission volume from the wafer during a process, prediction information of increase in the exhaust time, a prediction time of exhaust completion, etc., may be displayed with a warning to the display device 91, outputted with a warning to the output device 92, or reported to a superior production control system. A user of the device may utilize such information to improve process efficiency by correcting a processing procedure of the process, etc., based on the information.

The example of the prevention of the deterioration of the degree of vacuum in the electron gun 1 by closing the electron gun valve arranged between the specimen chamber 9 and the electron gun 1 has been described in order to protect the electron gun and ensure the stability of the electron beam. The similar application is possible for a case in which an interlock that prevents discharging for the high voltage in the specimen chamber 9 is provided so that the high voltage is cut off when the degree of vacuum of the specimen chamber 9 deteriorates.

<Effect of First Embodiment>

The scanning electron microscope of this embodiment as described above includes the electron source 1a, the specimen stage 7, the specimen chamber 9, and the exchange chamber 10, and further includes the vacuum gauge 42, the time counting unit 73, the integral control unit 78 and others, so that the integral control unit 78 can control for changing the contents of the subsequent process based on the shift of the degree of vacuum of the exchange chamber 10 (such as the vacuum exhaust time in the exchange chamber 10 when the specimen is in the exchange chamber 10 and the variation of the degree of vacuum of the exchange chamber 10 for a predetermined time interval when the specimen is in the exchange chamber 10).

More specifically, in examples of a vacuum exhaust time in the exchange chamber 10 when the specimen is in the exchange chamber 10, it is determined that the specimen emits a large volume of a gas, and the vacuum exhaust is continued to cause the high vacuum state if the vacuum exhaust time is long when the specimen is in the exchange chamber 10 at the specimen exchange, and it is determined that the specimen emits a small volume of a gas, and a predetermined set value is used as the degree of vacuum for determining exhaust completion for the exchange chamber 10 so as to complete the vacuum exhaust in a short time if the vacuum exhaust time is short.

In this case, the first predetermined degree of vacuum (p1) can be used as the degree of vacuum for determining exhaust completion for the exchange chamber if the time taken when the degree of vacuum has reached the first predetermined degree of vacuum (p1) is short, or the second predetermined degree of vacuum (p2) higher than the first predetermined degree of vacuum (p1) can be used as the degree of vacuum for determining exhaust completion for the exchange chamber if the time taken when the degree of vacuum has reached the first predetermined degree of vacuum (p1) is long (FIGS. 4 and 5).

Alternatively, the second predetermined degree of vacuum (p1) higher than the first predetermined degree of vacuum can be used as the degree of vacuum for determining exhaust completion for the exchange chamber if the time taken when the degree of vacuum has reached the first predetermined degree of vacuum (P0) is short, or a third predetermined degree of vacuum (p2) higher than the second predetermined degree of vacuum can be used as the degree of vacuum for determining exhaust completion for the exchange chamber if the time taken when the degree of vacuum has reached the first predetermined degree of vacuum (P0) is long (FIGS. 7 and 8).

For example, also in examples of the variation of the degree of vacuum of the exchange chamber 10 for the predetermined time interval when the specimen is in the specimen chamber 10, the first predetermined degree of vacuum can be used as the degree of vacuum for determining exhaust completion for the exchange chamber if the variation of the degree of vacuum at the time when the degree of vacuum has reached the predetermined degree of vacuum is large, or the second predetermined degree of vacuum higher than the first predetermined degree of vacuum can be used as the degree of vacuum for determining exhaust completion for the exchange chamber if the variation of the degree of vacuum at the when the degree of vacuum has reached the predetermined degree of vacuum is small.

In this manner, according to the scanning electron microscope of this embodiment, a value for determining vacuum exhaust completion for the exchange chamber is changed for each of a specimen that emits a large volume of a gas and a specimen that emits a small volume of a gas, so that stoppage or long suspension of the processing due to the decrease in the degree of vacuum of the specimen chamber 9 can be suppressed for the specimen that emits a large volume of a gas, and increase in the exhaust time in the exchange chamber 10 can be prevented for the specimen that emits a small volume of a gas, and the device which is appropriate for both specimens and which maintains the throughput can be provided.

And, merits for the user who uses the scanning electron microscope of this embodiment include to allow the user to measure the specimen that emits a large volume of a gas and to measure specimens without classifying the specimens by the gas emission volume from the specimen, and to prevent the decrease in the throughput for the specimen that emits a small volume of a gas.

Second Embodiment

Figure 9:
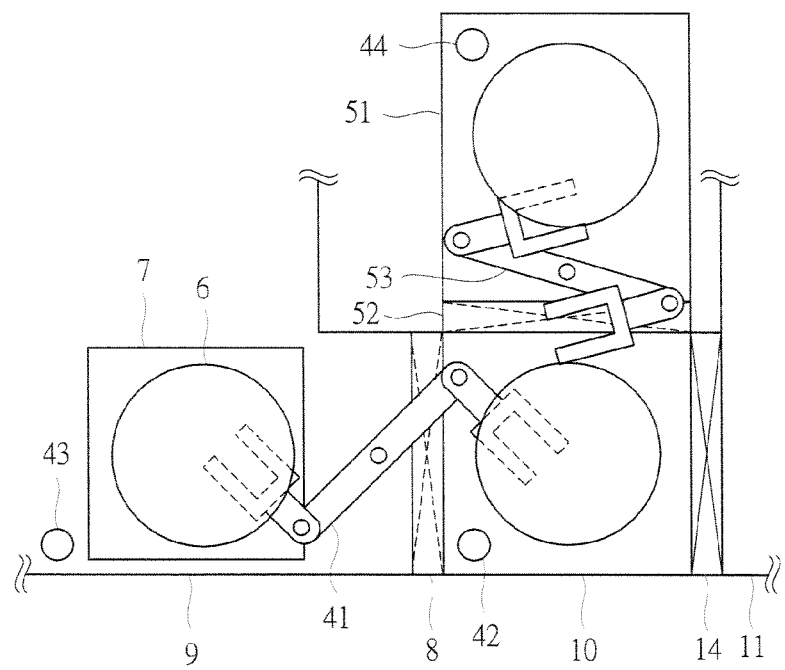
FIGS. 9A and 9B are diagrams each illustrating an example of a top view of the specimen transfer system in a scanning electron microscope according to a second embodiment of the present invention.

A second embodiment will then be described with reference to FIG. 9 in addition to FIGS. 1 and 2 described above.

According to the above-described first embodiment, even when the exhaust time is long, exhaust for the next specimen cannot be performed until the exhaust for the currently-exhausted specimen is finished. Therefore, even if the next specimen emits a small volume of a gas and therefore the exhaust can be performed in a short time, the next process has to stand by until the exhaust for the specimen during currently exhausting is finished. Therefore, there is concern that it takes long time until the process is finished if a process order even for the specimen that emits a small volume of a gas is put after the specimen that emits a large volume of a gas.

Therefore, there is a demand for a scanning electron microscope without the achievement of the standby of the specimen requiring the short exhaust time after the process of the specimen requiring the long exhaust time.

This embodiment will describe a method of exhausting the next specimen by temporarily evacuating a specimen with such a prediction as the long exhaust time in such a case.

<Configuration of Scanning Electron Microscope>

FIGS. 9A and 9B are diagrams each illustrating an example of a top view of the specimen transfer system, illustrating a modification example of the exchange chamber in the scanning electron microscope illustrated in FIG. 1 described above. A method of specimen transfer and vacuum exhaust according to a second embodiment will be described with reference to FIGS. 9A and 9B. FIGS. 9A and 9B illustrate examples which are different from each other in the method of specimen transfer and vacuum exhaust.

In FIG. 9A, a specimen exhaust chamber 51 is arranged at a side of the exchange chamber 10 exemplified in FIG. 2 described above. This specimen exhaust chamber 51 is provided with a specimen exhaust chamber valve 52, a specimen transfer robot 53 that transfers a specimen between the specimen exhaust chamber 51 and the exchange chamber 10, and a vacuum gauge 44.

In FIG. 9A, if it is predicted that the vacuum exhaust time is long based on the determination for the length of the vacuum exhaust time in the exchange chamber 10 after the wafer 6a is transferred to the exchange chamber 10, the specimen exhaust chamber valve 52 is opened, and the wafer 6b is evacuated to the specimen exhaust chamber 51 by the specimen transfer robot 53, and then, the specimen exhaust chamber valve 52 is closed. In the specimen exhaust chamber 51, vacuum exhaust is performed continuously by using a specimen exhaust chamber pump not illustrated.

Subsequently, the wafer 6 in a position of the next order is transferred from the wafer case 13 to the exchange chamber 10, and then, vacuum exhaust is performed by the same procedure as described above, and then, the wafer 6 is transferred to the specimen chamber 9 and is measured first prior to the wafer 6b evacuated to the specimen exhaust chamber 51. When the internal pressure of the specimen exhaust chamber 51 monitored with the vacuum gauge 44 has reached a predetermined pressure, the wafer 6b evacuated to the specimen exhaust chamber 51 is returned to the exchange chamber 10 and is transferred to the specimen chamber 9 as being in a next order of the currently processed wafer 6c, and is measured.

In this manner, the wafer positioned in the next order can be processed without the standby of the process for the wafer positioned in a previous order which emits a large volume of a gas and therefore requires the long vacuum exhaust time.

Also, when the above-described wafer positioned in the next order is transferred to the exchange chamber 10, either the wafer evacuated to the specimen exhaust chamber 51 or the wafer transferred to the exchange chamber 10 transferred later, whichever is earlier in the completion, may be transferred first to the specimen chamber 9 and be measured. Also, when it is predicted that the vacuum exhaust time for both of the wafer evacuated to the specimen exhaust chamber 51 and the wafer transferred to the exchange chamber 10 transferred later is longer than a predetermined vacuum exhaust time, either wafer may be returned to the wafer case 13 once, and the next wafer 6 may be transferred from the wafer case 13 to the exchange chamber 10 to be processed. In this manner, a wafer that emits a small volume of a gas is processed in priority. An ordering of the priority for the wafer that emits a small volume of a gas can be adjusted by allowing the user to set the predetermined vacuum exhaust time to be the criteria for determining whether or not to return the wafer once 12 to the wafer case 13.

As a modification example of the case of providing the specimen exhaust chamber 51, the specimen exhaust chamber 51 may have a structure capable of housing a plurality of wafers or a plurality of specimen exhaust chambers 51 may be provided so that a plurality of wafers are evacuated thereto. The plurality of specimen exhaust chambers 51 may be positioned opposite to the exchange chamber 10 in viewing from the existing specimen exhaust chamber 51 or opposite to the existing specimen exhaust chamber 51 in viewing from the exchange chamber 10.

Next, another method different from FIG. 9A described above will be described with reference to FIG. 9B. In FIG. 9B, a different exchange chamber 54 is arranged at a side of the exchange chamber 10 exemplified in FIG. 2 described above. This different exchange chamber 54 is provided with a specimen chamber valve 8a, an exchange chamber valve 14a, a specimen transfer robot 55 that transfers a specimen between the exchange chamber 54 and the specimen chamber 9, and a vacuum gauge 45.

In FIG. 9B, after the wafer 6a is transferred to the exchange chamber 10, a vacuum exhaust process in accordance with a gas emission volume is performed in the exchange chamber 10 by the same procedure as that in the first embodiment. Meanwhile, after the next wafer 6a is also transferred to the exchange chamber 54, a vacuum exhaust process in accordance with a gas emission volume is performed in the exchange chamber 54 by the same procedure as that in the first embodiment. The inner pressure of the exchange chamber 54 is monitored with the vacuum gauge 45. The wafer 6b is transferred to the specimen chamber 9 from either the exchange chamber 10 or the exchange chamber 54, whichever is earlier in the completion of the vacuum exhaust, and is measured. The wafer 6c after the measurement process is transferred to the wafer case 13. Subsequently, the wafer 6 positioned in the next order is transferred from the wafer case 13 to either the exchange chamber 10 or the exchange chamber 54, whichever is available, and is similarly subjected to the vacuum exhaust process in accordance with the gas emission volume, and the wafer 6b is transferred to the specimen chamber 9 from either the exchange chamber 10 or the exchange chamber 54, whichever is earlier in the completion of the vacuum exhaust, and is measured. The wafer 6 positioned in the next order as described above may be transferred during the measurement for the wafer in the previous order from the wafer case to either the exchange chamber 10 or the exchange chamber 54, whichever is available, and is subjected to the vacuum exhaust process.

If it is predicted that the vacuum exhaust for both wafers 6b in the exchange chambers 10 and 54 takes time longer than the predetermined vacuum exhaust time, either one of the wafers 6 may be returned to the wafer case 13 once, and the next wafer 6 may be transferred from the wafer case 13 to the exchange chamber to be processed. In this manner, a wafer that emits a small volume of a gas is processed in priority. An ordering of the priority for the wafer that emits a small volume of a gas can be adjusted by allowing the user to set the predetermined vacuum exhaust time to be the criteria for determining whether or not to return the wafer to the wafer case 13.

As a modification example of the case of providing a different exchange chamber 54, a plurality of exchange chambers 54 more than two illustrated in FIG. 9B may be provided. In combination with the embodiment in FIG. 9A, the example of FIG. 9B, the specimen exhaust chamber 51 may be provided in the plurality of exchange chambers illustrated in FIG. 9B.

<Effect of Second Embodiment>

According to the scanning electron microscope of this embodiment as described above, as similar to the first embodiment, it is both possible to prevent stoppage or long suspension of the processing due to a decrease in the degree of vacuum of the specimen chamber 9 for the specimen that emits a large volume of a gas, and to prevent increase in the exhaust time in the exchange chamber 10 for the specimen that emits a small volume of a gas, so that the device which is appropriate for both specimens and which maintains the throughput can be provided.

Further, according to this embodiment, by providing the scanning electron microscope with the specimen exhaust chamber 51, the specimen can be evacuated to the specimen exhaust chamber 51 so as to perform the vacuum exhaust if it is determined that the exhaust time in the exchange chamber 10 is long or the variation of the degree of vacuum of the exchange chamber 10 is small and therefore the gas emission volume from the specimen is large. Also, the same goes for the case of providing the exchange chamber 54 different from the exchange chamber 10. As a result, a specimen that emits a small volume of a gas does not have to stand by for the process for the specimen that emits a large volume of a gas, so that the device that maintains the throughput for the specimen that emits a small volume of a gas can be provided. Also, the vacuum exhaust process can be performed simultaneously even during the evacuation for the specimen that emits a large volume of a gas, and therefore, it can be expected to shorten the total processing time for all specimens.

Third Embodiment

A third embodiment will be described with reference to FIGS. 1, 2, 9A, and 9B.

The third embodiment provides a combination of methods of accelerating the gas emission by an auxiliary configuration to shorten the exhaust time if it is determined that the gas emission volume from the specimen is large.

As one example, the scanning electron microscope exemplified in FIG. 1 described above is provided with a vacuum pump connected so as to be capable of switching between the exchange chamber 10 and the specimen chamber 9 and performing the vacuum exhaust although not illustrated as different from the specimen chamber pump 9a and the exchange chamber pump 10a. By such a switched and connected vacuum pump, the vacuum exhaust is controlled to be performed in either the exchange chamber 10 or the specimen chamber 9 to which the wafer determined as emitting a large volume of a gas is transferred.

As another example, the exchange chambers 10 and 54 and the specimen exhaust chamber 51 of FIGS. 2 and 9B and 9A described above are provided with a specimen heat treatment mechanism that performs a heat treatment on the specimen, respectively. If it is determined that the gas emission volume from the specimen is large, the vacuum exhaust is performed while the specimen is subjected to the heat treatment. It is preferable to perform the heat treatment after determining whether or not to perform the heat treatment based on information unique for the wafer.

According to the scanning electron microscope of this embodiment as described above, as similar to the first and second embodiments, it is both possible to prevent stoppage or long suspension of the processing due to a decrease in the degree of vacuum of the specimen chamber 9 for the specimen that emits a large volume of a gas, and to prevent increase in the exhaust time in the exchange chambers 10 and 54 for the specimen that emits a small volume of a gas, so that the device which is appropriate for both specimens and which maintains the throughput can be provided.

Further, according to this embodiment, by providing the scanning electron microscope with the vacuum pump, the vacuum exhaust can be controlled to be performed in either the exchange chamber 10 or the specimen chamber 9 to which the specimen is transferred, the specimen being determined that the exhaust time in the exchange chamber 10 is long or the variation of the degree of vacuum of the exchange chamber 10 is small and therefore the gas emission volume from the specimen is large. Also, in the case of providing the scanning electron microscope with the specimen heat treatment mechanism, the vacuum exhaust is performed while the specimen is subjected to the heat treatment if it is determined that the gas emission volume from the specimen is large. As a result, for the specimen that emits a large volume of a gas, the gas emission can be accelerated by the auxiliary configuration such as the vacuum pump and the specimen heat treatment mechanism, so that the exhaust time can be shortened.

Fourth Embodiment

A fourth embodiment will be described with reference to FIG. 1 described above.

In the above-described first to third embodiments, the subsequent process is selected by determining that the gas emission volume from the wafer is either large or small is determined based on the vacuum exhaust time in the exchange chamber 10. In the fourth embodiment, a method of the specimen transfer and vacuum exhaust process is selected based on information on a gas emission volume added to the information unique for the wafer.

Accordingly, in the fourth embodiment, means for acquiring information unique for the specimen is provided. For example, the controller 71 exemplified in FIG. 3 described above is provided with an information acquiring device 93 connected to the controller 71. Information on a gas emission volume added to the information unique for the specimen acquired by the information acquiring device 93 is loaded into the controller 71, and is used for selecting the method of the specimen transfer and vacuum exhaust process.

The information on a gas emission volume may directly indicate whether a gas emission volume is either large or small, may be determined by analyzing process information acquired through processes, may be on the basis of information and an instruction from a manufacturing process control system different from the device, or may be acquired by referring to a database.

According to the scanning electron microscope of this embodiment as described above, as similar to the first to third embodiments, it is both possible to prevent stoppage or long suspension of the processing due to the decrease in the degree of vacuum of the specimen chamber 9 for the specimen that emits a large volume of a gas, and to prevent increase in exhaust time in the exchange chamber 10 for the specimen that emits a small volume of a gas, so that the device which is appropriate for both specimens and which maintains the throughput can be provided.

Further, according to this embodiment, by providing the scanning electron microscope with the information acquiring device 93 that acquires the information unique for the specimen, the integral control unit 78 can perform the control for changing the contents of the subsequent process based on the information (such as information on the gas emission volume from the specimen) unique for the specimen acquired by the information acquiring device 93.

More specifically, for example, the first predetermined degree of vacuum can be used as the degree of vacuum for determining exhaust completion for the exchange chamber if it is determined that the gas emission volume from the specimen is small, and the second predetermined degree of vacuum higher than the first predetermined degree of vacuum can be used as the degree of vacuum for determining exhaust completion for the exchange chamber if it is determined that the gas emission volume from the specimen is large. As a result, the method of the specimen transfer and vacuum exhaust process can be selected based on the information on the gas emission volume added to the information unique for the specimen.

In the foregoing, the invention made by the inventors has been concretely described based on the embodiments. However, it is needless to say that the present invention is not limited to the foregoing embodiments and various modifications and alterations can be made within the scope of the present invention.

INDUSTRIAL APPLICABILITY

The charged particle beam device of the present invention can be particularly used as a charged particle beam device having a valve element arranged between a preliminary exhaust chamber of the charged particle beam device and a specimen chamber in which a specimen which is an irradiation target of the charged particle beam is placed. For example, the charged particle beam device can be applied to a scanning electron microscope, a focused ion beam device, and a device in which a beam source may be affected by variation in the degree of vacuum of the specimen chamber.

SYMBOL EXPLANATION 1 electron gun
1a electron source
2 electron optical system
3 condenser lens
4 objective lens
6 and 6a to 6c wafer
7 specimen stage
8 and 8a specimen chamber valve
9 specimen chamber
9a specimen chamber pump
10 exchange chamber
10a exchange chamber pump
11 local exhaust chamber
12 specimen transfer robot
13 wafer case
14 and 14a exchange chamber valve
15 valve element receptor
16 valve element
17 diaphragm
18 valve element drive system
41 specimen transfer robot
42 vacuum gauge
43 vacuum gauge
44 vacuum gauge
45 vacuum gauge
51 specimen exhaust chamber
52 specimen exhaust chamber valve
53 specimen transfer robot
54 exchange chamber
55 specimen transfer robot
71 controller
72 pressure monitoring unit
73 time counting unit
74 vacuum pump control unit
75 specimen valve opening/closing control unit
76 specimen transfer robot control unit
77 valve element control unit
78 integral control unit
79 condition memory unit
80 result memory unit
91 display device
92 output device

The invention claimed is:

1. A charged particle beam device comprising:
a charged particle source;
a specimen stage for holding a specimen to be irradiated with a charged particle beam emitted from the charged particle source;
a specimen chamber that turns an atmosphere in which the specimen held by the specimen stage is placed into a vacuum state;
a specimen exchange chamber that turns an atmosphere of the specimen to be guided into the specimen chamber into a vacuum state;
a vacuum gauge that measures an internal pressure of the specimen exchange chamber;
a timer for measuring time taken until a measured result by the vacuum gauge reaches a first predetermined degree of vacuum; and
a controller configured to:
  perform a comparative calculation and a determination based on a measurement result from the time measuring unit, and integral control based on a process flow; and
  open a valve arranged between the specimen chamber and the specimen exchange chamber (1) when the measured result by the vacuum gauge reaches the first predetermined degree of vacuum before the time measured by the time measuring unit exceeds a predetermined time, or (2) when the measured result by the vacuum gauge does not reach the first predetermined degree of vacuum before the time measured by the time measuring unit exceeds the predetermined time, but then reaches a second predetermined degree of vacuum which is a higher degree of vacuum than the first predetermined degree of vacuum.

2. A charged particle beam device comprising:
a charged particle source;
a specimen stage for holding a specimen to be irradiated with a charged particle beam emitted from the charged particle source;
a specimen chamber that turns an atmosphere in which the specimen held by the specimen stage is placed into a vacuum state;
a specimen exchange chamber that turns an atmosphere of the specimen to be guided into the specimen chamber into a vacuum state;

a vacuum gauge that measures an internal pressure of the specimen exchange chamber;
a timer for measuring time taken until a measured result by the vacuum gauge reaches a first predetermined degree of vacuum; and
a controller configured to:
  perform a comparative calculation and a determination based on a measurement result from the time measuring unit and integral control based on a process flow; and
  open a valve arranged between the specimen chamber and the specimen exchange chamber (1) when the measured result by the vacuum gauge reaches the first predetermined degree of vacuum before the time measured by the time measuring unit exceeds a predetermined time, and then reaches a second predetermined degree of vacuum which is a higher degree of vacuum than the first predetermined degree of vacuum, or (2) when the measured result by the vacuum gauge does not reach the first predetermined degree of vacuum before the time measured by the time measuring unit exceeds the predetermined time, but then reaches a third predetermined degree of vacuum which is a higher degree of vacuum than the second predetermined degree of vacuum.

3. A charged particle beam device comprising:
a charged particle source;
a specimen stage for holding a specimen to be irradiated with a charged particle beam emitted from the charged particle source;
a specimen chamber that turns an atmosphere in which the specimen held by the specimen stage is placed into a vacuum state;
a specimen exchange chamber that turns an atmosphere of the specimen to be guided into the specimen chamber into a vacuum state;
a vacuum gauge that measures an internal pressure of the specimen exchange chamber;
a timer for measuring time taken until a measured result by the vacuum gauge reaches a first predetermined degree of vacuum; and
a controller configured to:
  perform a comparative calculation and a determination based on a measurement result from the time measuring unit and integral control based on a process flow; and
  open a valve arranged between the specimen chamber and the specimen exchange chamber, when (1) a degree of vacuum in the exchange chamber varies to become equal to or greater than the first predetermined degree of vacuum before the time measured by the time measuring unit exceeds a predetermined time, or (2) the degree of vacuum in the exchange chamber does not vary to become equal to or greater than the first predetermined degree of vacuum before the time measured by the time measuring unit exceeds the predetermined time, but then varies to become equal to or greater than a second predetermined degree of vacuum which is a higher degree of vacuum than the first predetermined degree of vacuum.

4. A charged particle beam device comprising:
a charged particle source;
a specimen stage for holding a specimen to be irradiated with a charged particle beam emitted from the charged particle source;
a specimen chamber that turns an atmosphere in which the specimen held by the specimen stage is placed into a vacuum state;
a specimen exchange chamber that turns an atmosphere of the specimen to be guided into the specimen chamber into a vacuum state;
a vacuum gauge that measures an internal pressure of the specimen exchange chamber;
a timer for measuring time taken until a measured result by the vacuum gauge reaches a predetermined degree of vacuum;
a controller configured to performs a comparative calculation and a determination based on a measurement result from the time measuring unit and integral control based on a process flow; and
a specimen heat treatment mechanism, wherein
if it is determined that a gas emission volume from the specimen is large, the vacuum exhaust is performed while the specimen is subjected to heat treatment by the specimen heat treatment mechanism.

5. A charged particle beam device comprising:
a charged particle source;
a specimen stage for holding a specimen to be irradiated with a charged particle beam emitted from the charged particle source;
a specimen chamber that turns an atmosphere in which the specimen held by the specimen stage is placed into a vacuum state;
a specimen exchange chamber that turns an atmosphere of the specimen to be guided into the specimen chamber into a vacuum state;
a vacuum gauge that measures an internal pressure of the specimen exchange chamber; and
a controller configured to:
  obtain information unique to the specimen, the information including information on a gas emission volume from the specimen;
  perform a comparative calculation and a determination based on information acquired by the information acquiring device, and integral control based on a process flow; and
  open a valve arranged between the specimen chamber and the specimen exchange chamber (1) when the gas emission volume from the specimen is smaller relative to a predetermined value and the measured result by the vacuum gauge reaches the first predetermined degree of vacuum, and (2) when the gas emission volume from the specimen is greater relative to the predetermined value and the measured result by the vacuum gauge reaches a second predetermined degree of vacuum which is a higher degree of vacuum than the first predetermined degree of vacuum.

* * * * *